(12) United States Patent
Swain et al.

(10) Patent No.: US 10,770,814 B2
(45) Date of Patent: Sep. 8, 2020

(54) ORTHOGONAL ELECTRICAL CONNECTOR ASSEMBLY

(71) Applicant: FCI USA LLC, Etters, PA (US)

(72) Inventors: Wilfred J. Swain, Mechanicsburg, PA (US); Steven E. Minich, York, PA (US); Mark R. Gray, York, PA (US)

(73) Assignee: FCI USA LLC, Etters, PA (US)

( * ) Notice: Subject to any disclaimer, the term of this patent is extended or adjusted under 35 U.S.C. 154(b) by 202 days.

(21) Appl. No.: 15/747,415

(22) PCT Filed: Aug. 5, 2016

(86) PCT No.: PCT/US2016/045829
§ 371 (c)(1),
(2) Date: Jan. 24, 2018

(87) PCT Pub. No.: WO2017/024244
PCT Pub. Date: Feb. 9, 2017

(65) Prior Publication Data
US 2018/0219314 A1    Aug. 2, 2018

Related U.S. Application Data

(60) Provisional application No. 62/201,711, filed on Aug. 6, 2015.

(51) Int. Cl.
*H01R 12/73* (2011.01)
*H01R 12/72* (2011.01)
(Continued)

(52) U.S. Cl.
CPC ......... *H01R 12/737* (2013.01); *H01R 12/716* (2013.01); *H01R 12/724* (2013.01);
(Continued)

(58) Field of Classification Search
CPC .. H01R 12/737; H01R 12/716; H01R 12/724; H01R 13/518; H01R 13/516;
(Continued)

(56) References Cited

U.S. PATENT DOCUMENTS

| 7,108,556 B2 * | 9/2006 | Cohen | H01R 23/688 |
| | | | 361/788 |
| 7,500,871 B2 * | 3/2009 | Minich | H01R 12/727 |
| | | | 439/544 |

(Continued)

FOREIGN PATENT DOCUMENTS

| CN | 102386507 A | 3/2012 |
| CN | 102598431 A | 7/2012 |

(Continued)

OTHER PUBLICATIONS

PCT/US2016/045829, Nov. 29, 2016, International Search Report and Written Opinion.

(Continued)

*Primary Examiner* — Edwin A. Leon
(74) *Attorney, Agent, or Firm* — Wolf, Greenfield & Sacks, P.C.

(57) ABSTRACT

A direct mate orthogonal electrical connector assembly includes first and second electrical connectors configured to be mated to respective first and second substrates such that the second substrate is perpendicular to the first substrate.

20 Claims, 10 Drawing Sheets

(51) Int. Cl.
*H01R 12/71* (2011.01)
*H01R 13/518* (2006.01)
*H05K 3/36* (2006.01)

(52) U.S. Cl.
CPC ........... *H01R 13/518* (2013.01); *H05K 3/366* (2013.01); *H05K 2201/10189* (2013.01)

(58) Field of Classification Search
CPC ............ H01R 13/6471; H01R 13/6585; H01R 12/7005; H01R 13/6463; H01R 13/6587; H05K 3/366; H05K 2201/10189
See application file for complete search history.

(56) References Cited

U.S. PATENT DOCUMENTS

| | | | | | |
|---|---|---|---|---|---|
| 7,988,456 | B2* | 8/2011 | Davis | ................... | H01R 12/724 |
| | | | | | 439/65 |
| 8,366,485 | B2* | 2/2013 | Johnescu | ............. | H01R 13/514 |
| | | | | | 439/607.07 |
| 2004/0224559 | A1* | 11/2004 | Nelson | ................. | H01R 13/514 |
| | | | | | 439/607.05 |
| 2005/0215121 | A1* | 9/2005 | Tokunaga | ............ | H01R 12/585 |
| | | | | | 439/607.13 |
| 2007/0099455 | A1* | 5/2007 | Rothermel | ........... | H01R 12/585 |
| | | | | | 439/108 |
| 2007/0207641 | A1* | 9/2007 | Minich | ................ | H01R 23/688 |
| | | | | | 439/79 |
| 2013/0273781 | A1 | 10/2013 | Buck et al. | | |
| 2013/0330941 | A1 | 12/2013 | Jeon | | |
| 2014/0057493 | A1 | 2/2014 | De Geest et al. | | |
| 2014/0209371 | A1 | 7/2014 | Minich et al. | | |

FOREIGN PATENT DOCUMENTS

| | | |
|---|---|---|
| CN | 102684009 A | 9/2012 |
| JP | 2011-175870 A | 9/2011 |
| JP | 2013-041789 A1 | 2/2013 |

OTHER PUBLICATIONS

PCT/US2016/045829, Feb. 15, 2018, International Preliminary Report on Patentability.
International Search Report and Written Opinion for International Application No. PCT/US2016/045829 dated Nov. 29, 2016.
International Preliminary Report on Patentability for International Application No. PCT/US2016/045829 dated Feb. 15, 2018.
Chinese office action for Chinese Application No. 201680046281.1 dated Oct. 24, 2019.
CN 201680046281.1, Oct. 24, 2019, Chinese Office Action.

* cited by examiner

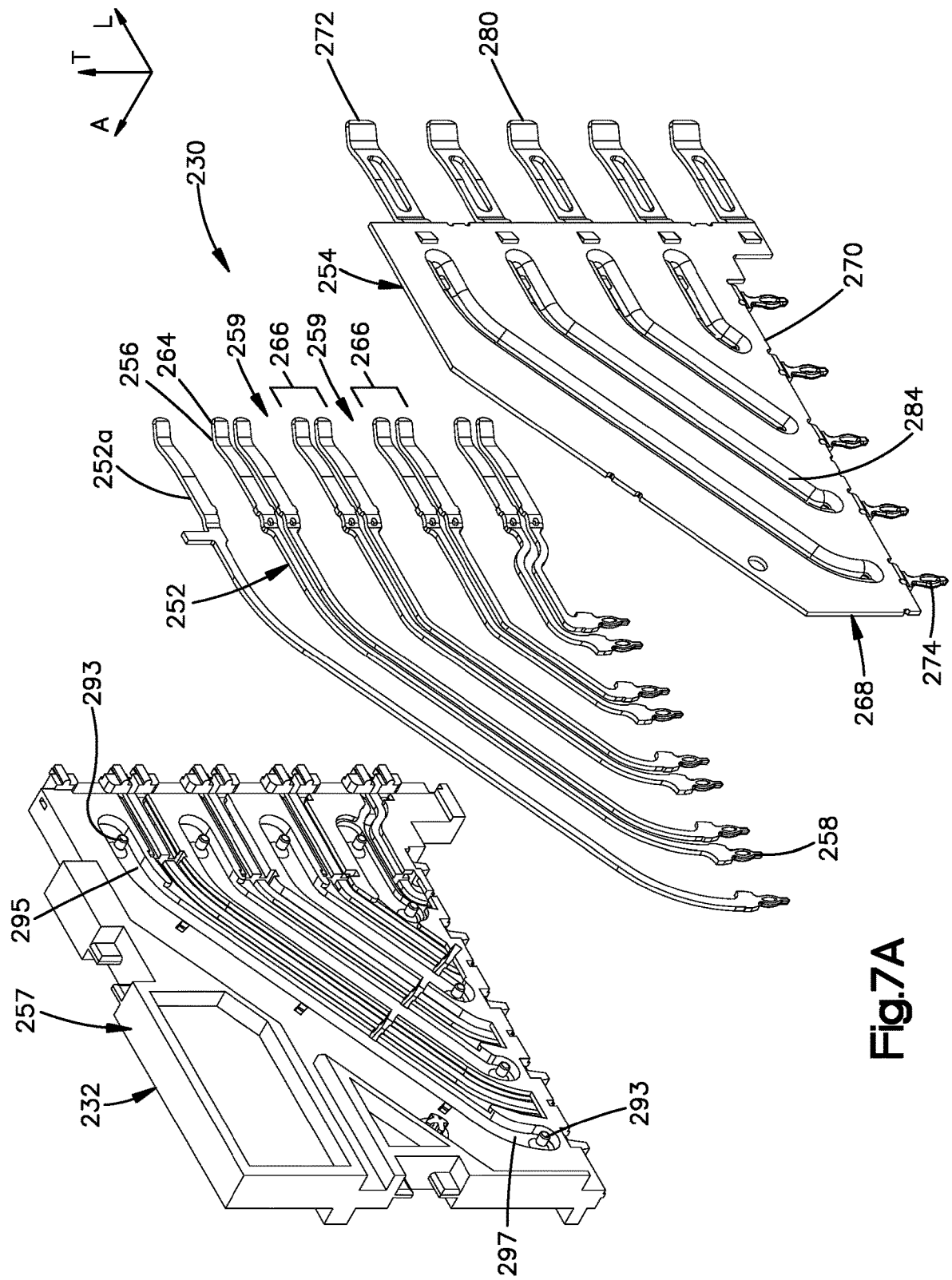

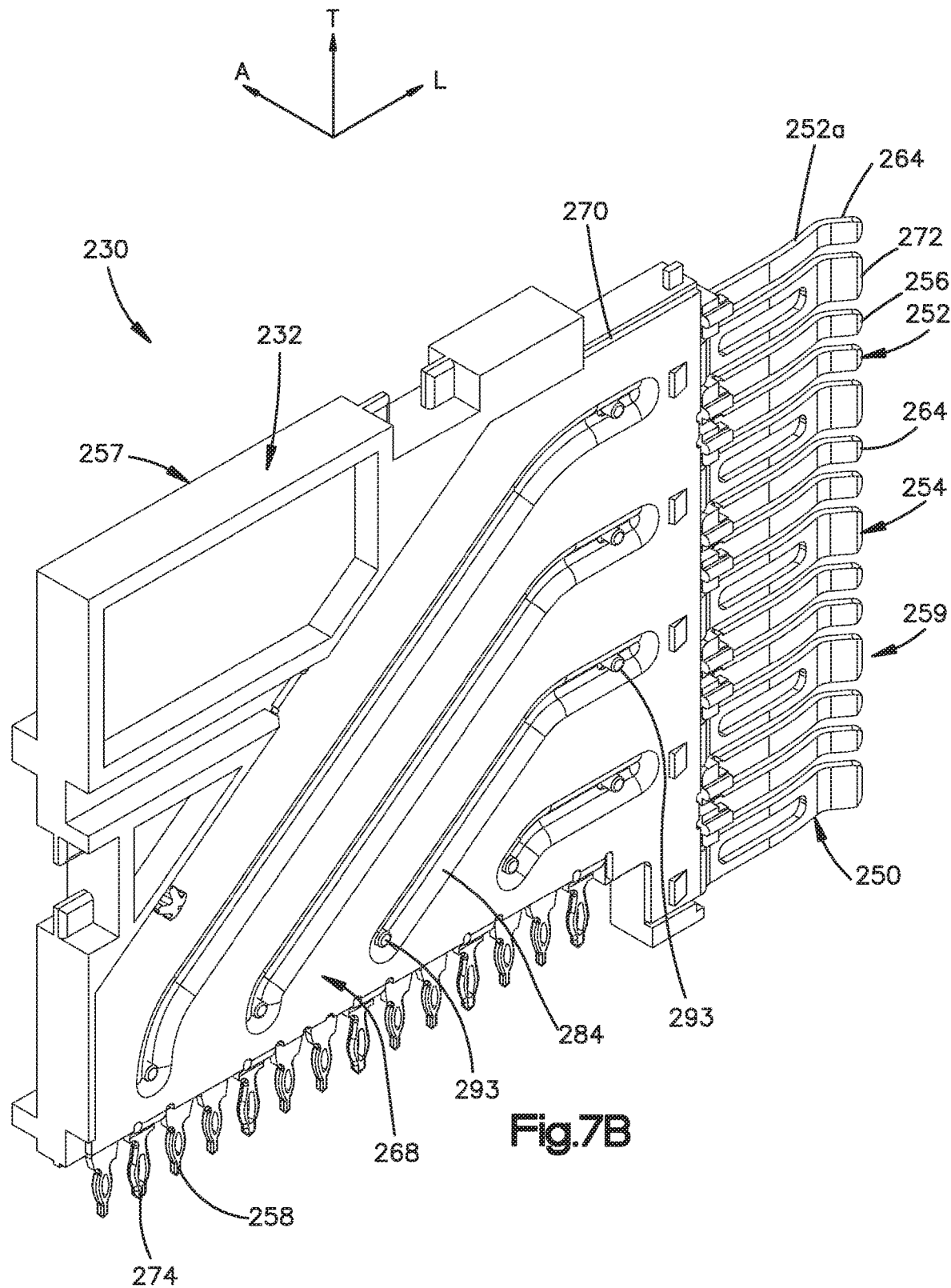

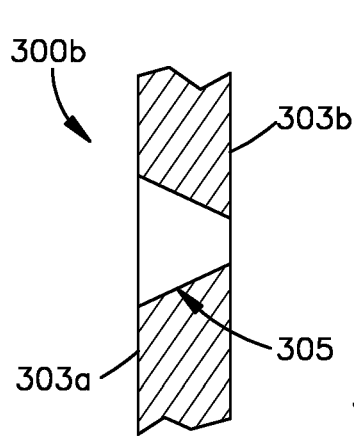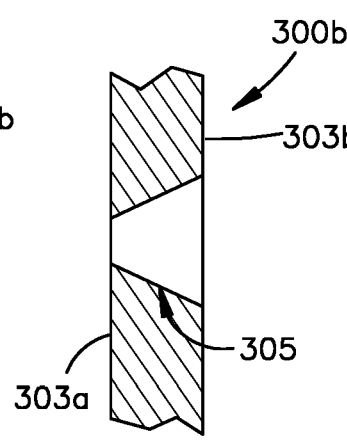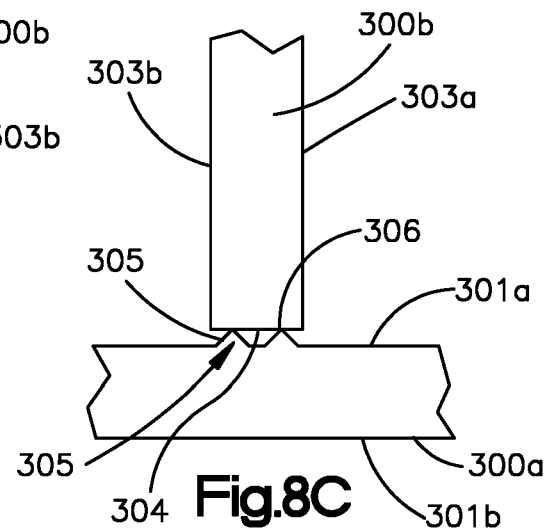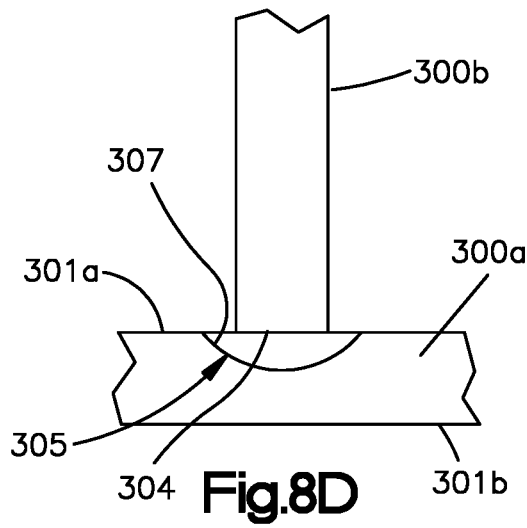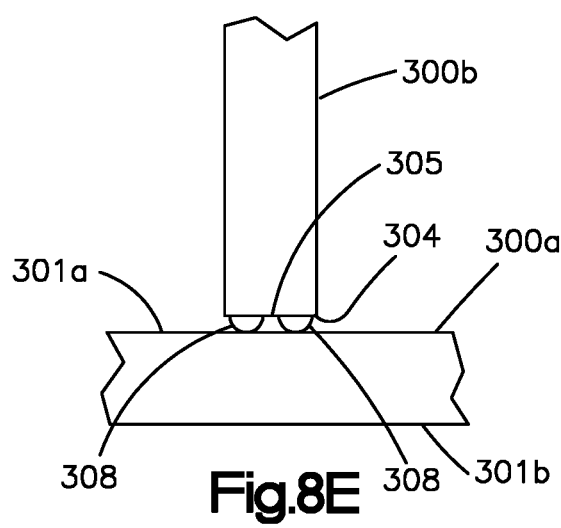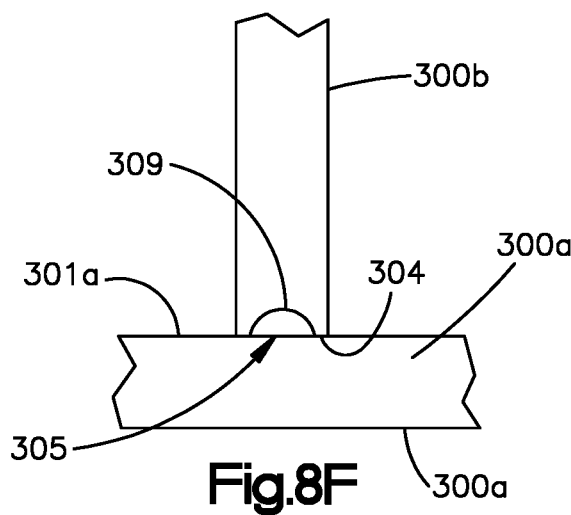

ORTHOGONAL ELECTRICAL CONNECTOR ASSEMBLY

CROSS-REFERENCE TO RELATED APPLICATIONS

This application is a National Phase Entry of international PCT patent application No. PCT/US2016/045829, entitled "ORTHOGONAL ELECTRICAL CONNECTOR ASSEMBLY" filed on Aug. 5, 2016, which claims priority to and the benefit of U.S. Provisional Application Ser. No. 62/201,711, entitled "ORTHOGONAL ELECTRICAL CONNECTOR ASSEMBLY" filed on Aug. 6, 2015. The entire contents of these applications are incorporated herein by reference in their entirety.

BACKGROUND

Direct mate orthogonal electrical connector assemblies include first and second electrical connectors that are mounted to respective substrates, such that the first and second substrates are oriented perpendicular to each other when the first and second electrical connectors are mated to each other along a mating direction. In conventional direct mate orthogonal electrical connector assemblies, the substrates are spaced from each other along the mating direction.

SUMMARY

In some embodiments, an electrical connector assembly can include a first electrical connector comprising an electrically insulative first housing and a first plurality of electrical contacts supported by the first housing, wherein the first electrical connector defines a first mating interface and a first mounting interface oriented perpendicular to the first mating interface, wherein the first mounting interface is configured to be mounted to a first substrate that is oriented along a first plane. The electrical connector assembly can further include a second electrical connector comprising an electrically insulative second housing and a second plurality of electrical contacts supported by the second housing, wherein the second electrical connector defines a second mating interface and a second mounting interface oriented perpendicular to the second mating interface, wherein the second mounting interface is configured to be mounted to a second substrate that is oriented along a second plane. The first and second electrical connectors can be configured to mate with each other at their respective first and second mating interfaces, such that the second plane is substantially perpendicular to the first plane.

In some embodiments, an electrical connector assembly can include a first electrical connector comprising an electrically insulative first housing and a first plurality of electrical contacts supported by the first housing, wherein the first electrical connector defines a first mating interface and a first mounting interface oriented perpendicular to the first mating interface, wherein the first mounting interface is configured to be mounted to a first substrate that is oriented along a first plane. The electrical connector assembly can further include a second electrical connector comprising an electrically insulative second housing and a second plurality of electrical contacts supported by the second housing, wherein the second electrical connector defines a second mating interface and a second mounting interface oriented perpendicular to the second mating interface, wherein the second mounting interface is configured to be mounted to a second substrate that is oriented along a second plane. The first and second electrical connectors can be configured to mate with each other at their respective first and second mating interfaces, such that the second plane is substantially perpendicular to the first plane.

The foregoing is a non-limiting summary of the invention, which is defined by the appended claims.

DESCRIPTION OF THE DRAWINGS

The foregoing summary, as well as the following detailed description of an example embodiment of the application, will be better understood when read in conjunction with the appended drawings, in which there is shown in the drawings example embodiments for the purposes of illustration. It should be understood, however, that the application is not limited to the precise arrangements and instrumentalities shown. In the drawings:

FIG. 7A is an exploded perspective view of a leadframe assembly of the second electrical connector illustrated in FIG. 6;

FIG. 7B is an assembled perspective view of the leadframe assembly illustrated in FIG. 7A;

FIG. 8A is a schematic sectional side elevation view of a second substrate of the electrical connector assembly illustrated in FIG. 1A, illustrating an air ventilation opening constructed in accordance with one embodiment;

FIG. 8B is a schematic sectional side elevation view of a second substrate of the electrical connector assembly illustrated in FIG. 1A, illustrating an air ventilation opening constructed in accordance with another embodiment;

FIG. 8C is a schematic side elevation view of an interface between a first substrate and a second substrate of the electrical connector assembly illustrated in FIG. 1A, illustrating an air ventilation opening constructed in accordance with another embodiment;

FIG. 8D is a schematic side elevation view of an interface between a first substrate and a second substrate of the electrical connector assembly illustrated in FIG. 1A, illustrating an air ventilation opening constructed in accordance with another embodiment;

FIG. 8E is a schematic side elevation view of an interface between a first substrate and a second substrate of the electrical connector assembly illustrated in FIG. 1A, illustrating an air ventilation opening constructed in accordance with another embodiment; and FIG. 8F is a schematic side elevation view of an interface between a first substrate and a second substrate of the electrical connector assembly illustrated in FIG. 1A, illustrating an air ventilation opening constructed in accordance with another embodiment.

DETAILED DESCRIPTION

Figure 1A:
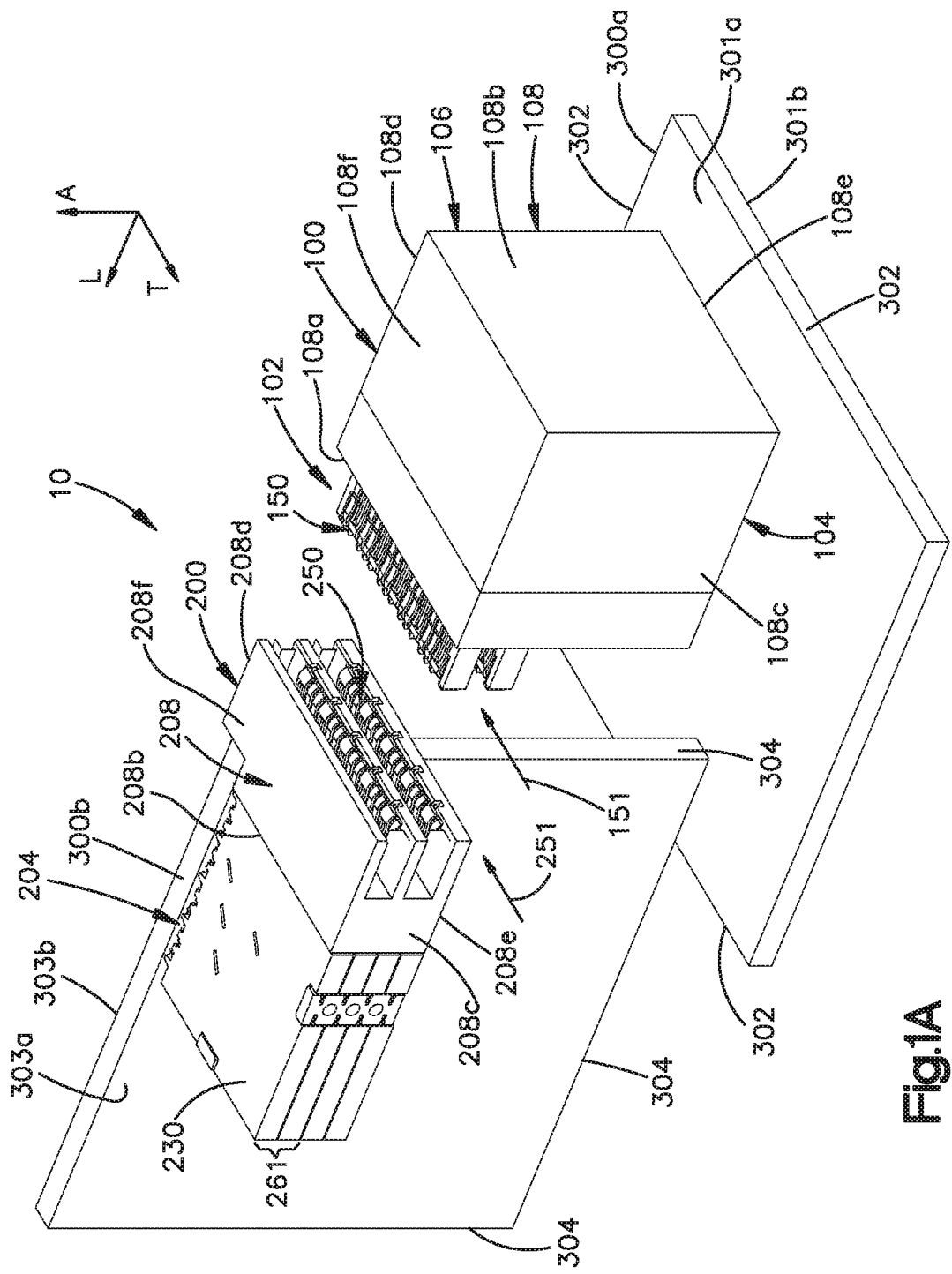
FIG. 1A is a perspective view of an orthogonal electrical connector assembly constructed in accordance with one embodiment.
Figure 1B:
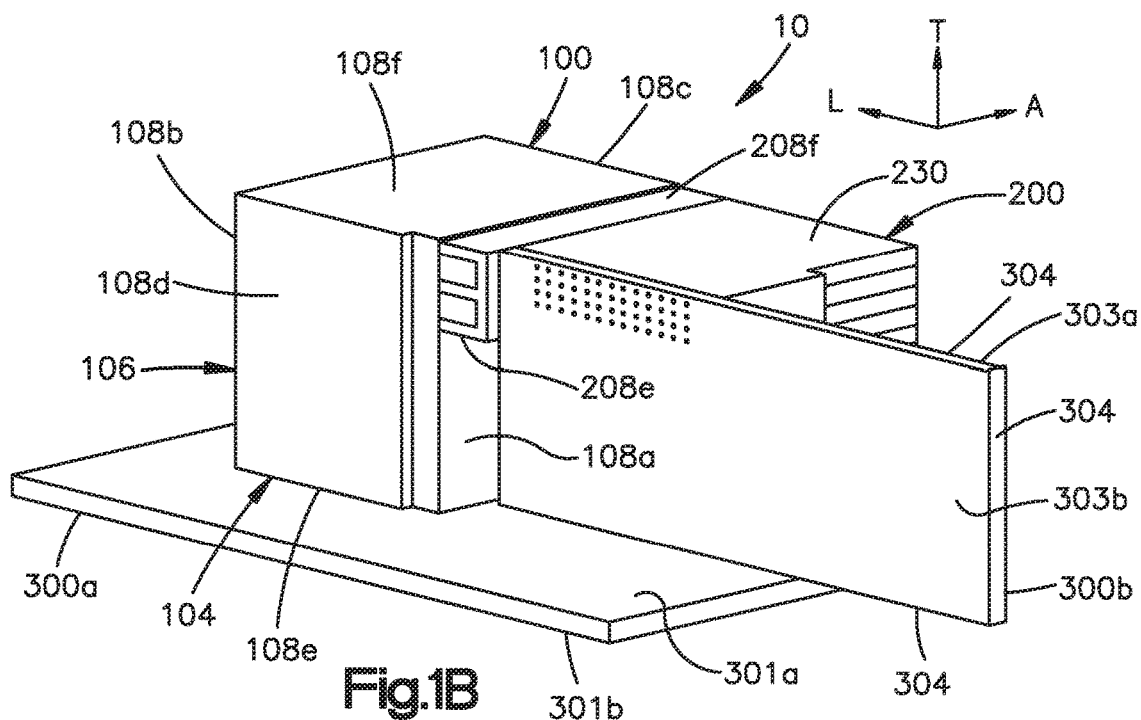
FIG. 1B is a perspective view of the orthogonal electrical connector assembly illustrated in FIG. 1A, showing first and second electrical connectors mated to each other.
Figure 1C:
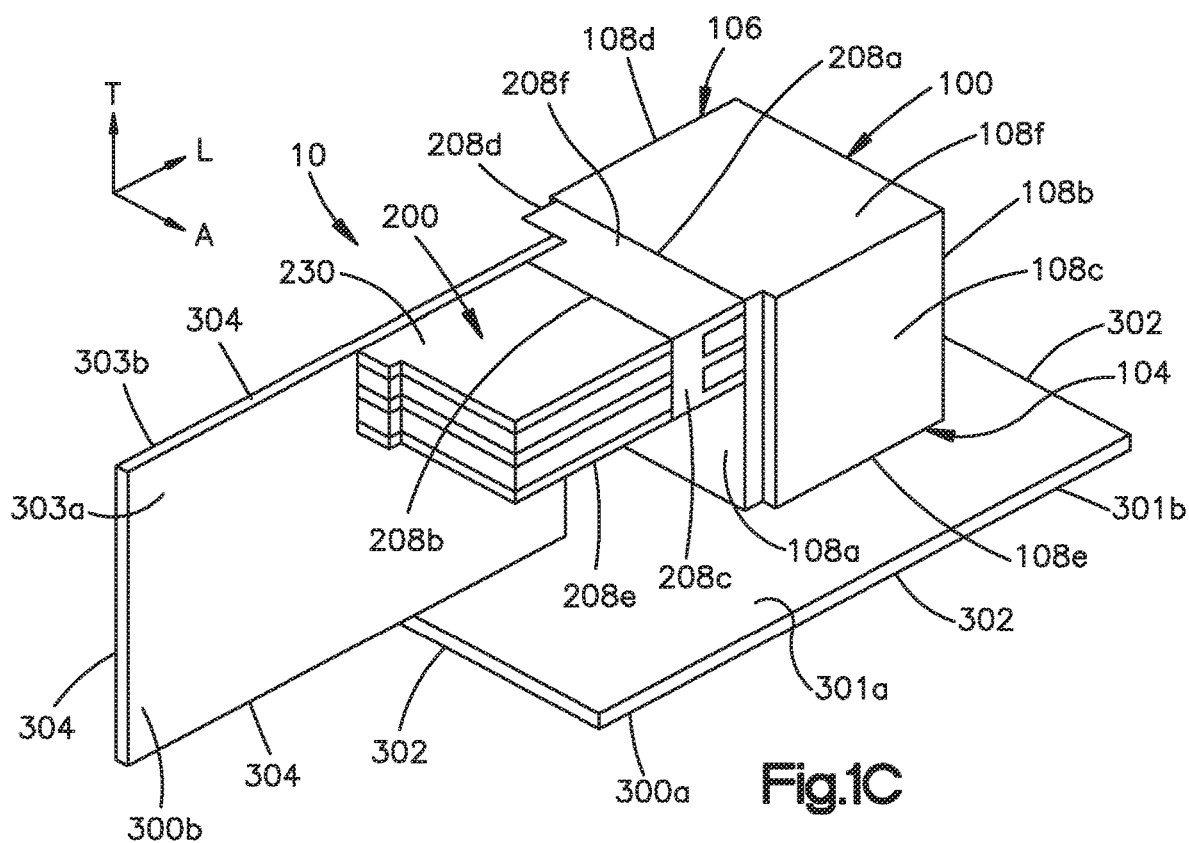
FIG. 1C is a perspective view of the orthogonal electrical connector assembly illustrated in FIG. 1B.
Figure 2A:
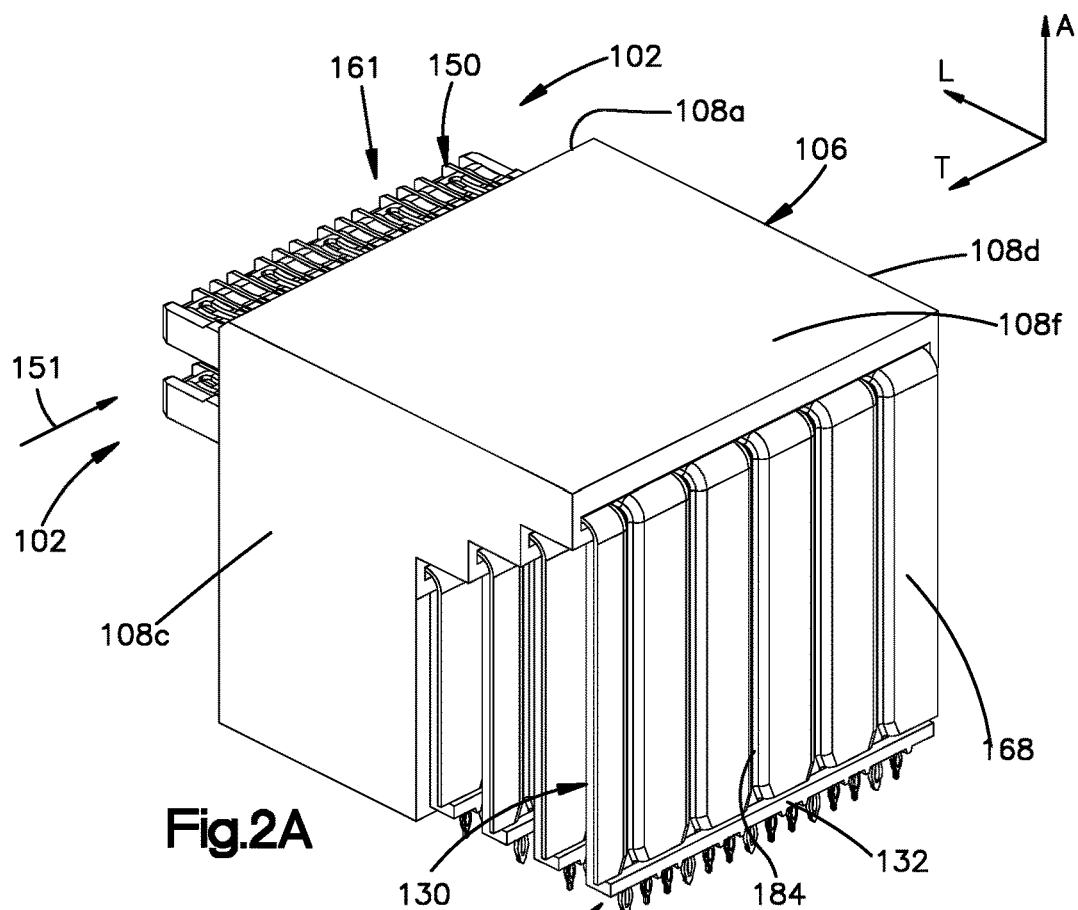
FIG. 2A is a perspective view of the first electrical connector illustrated in FIG. 1.
Figure 2B:
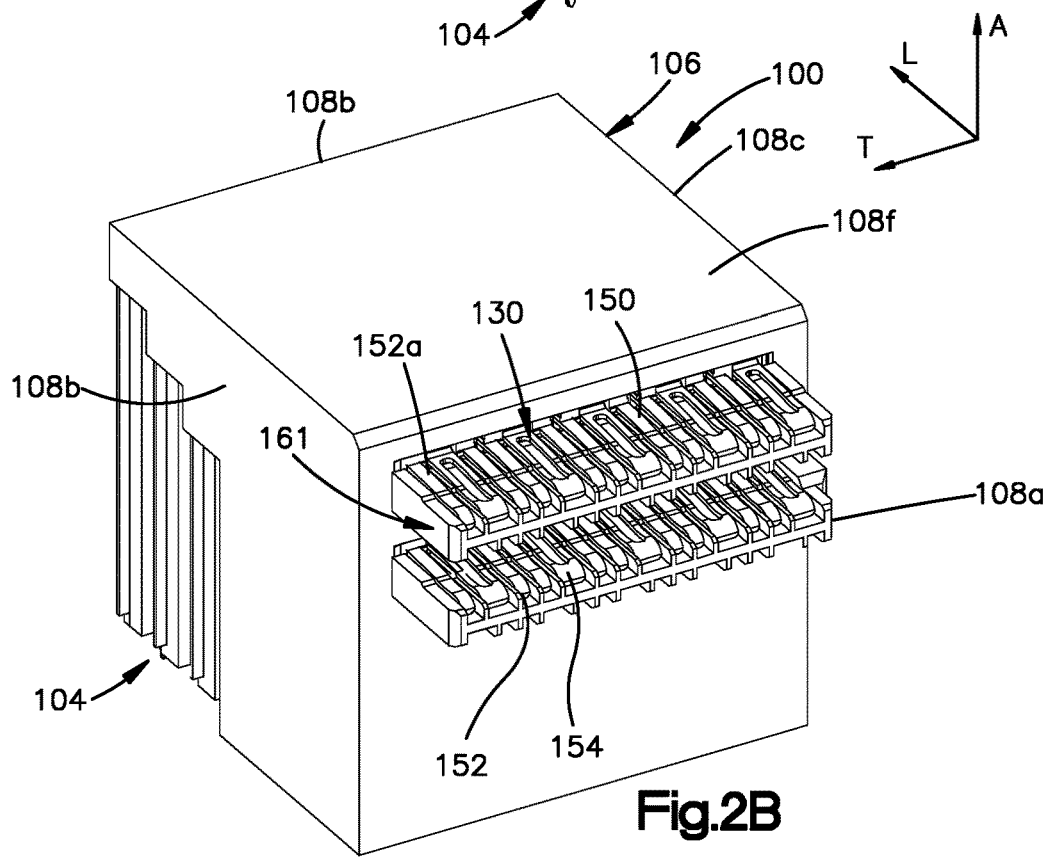
FIG. 2B is another perspective view of the first electrical connector illustrated in FIG. 1.
Figure 3A:
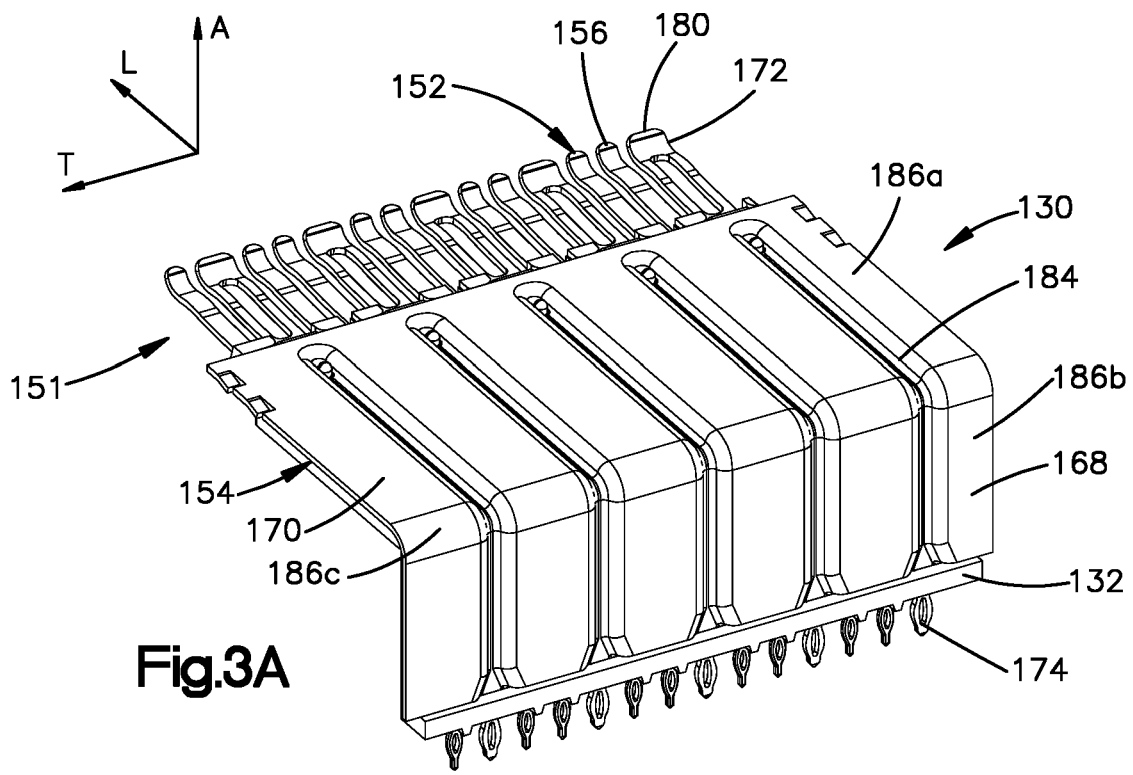
FIG. 3A is a perspective view of a leadframe assembly of the first electrical connector illustrated in FIG. 2A.
Figure 3B:
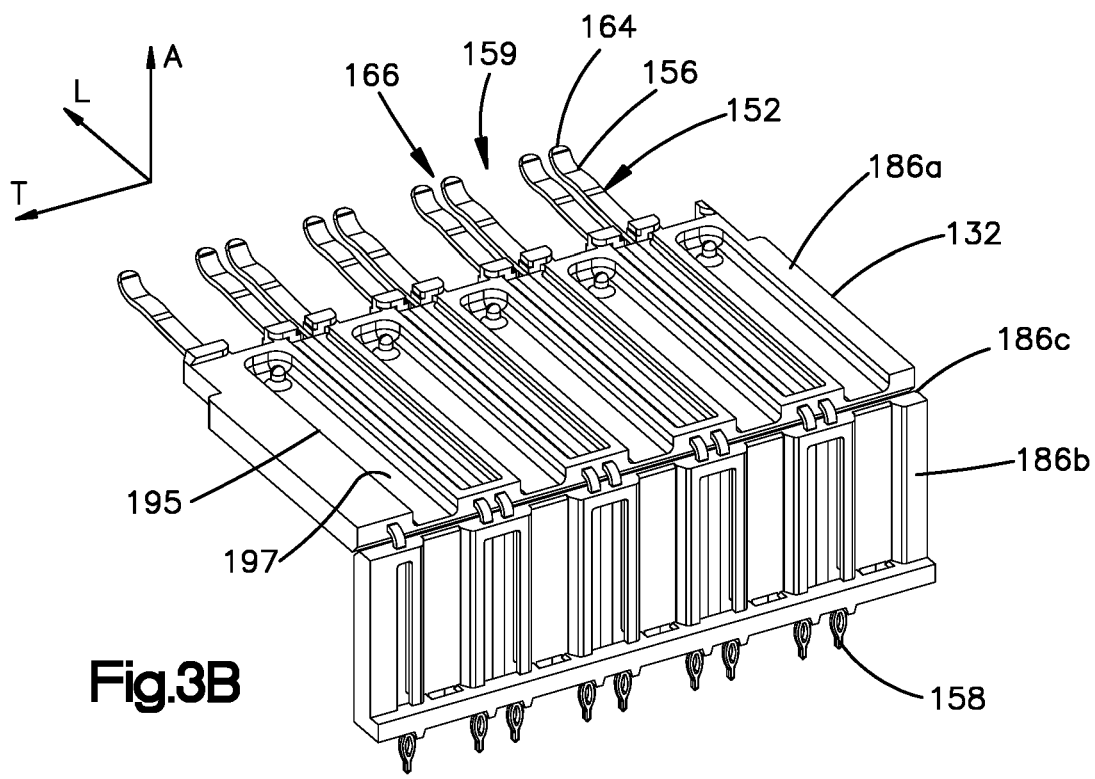
FIG. 3B is a perspective view of a portion of the leadframe assembly illustrated in FIG. 3A.
Figure 4:
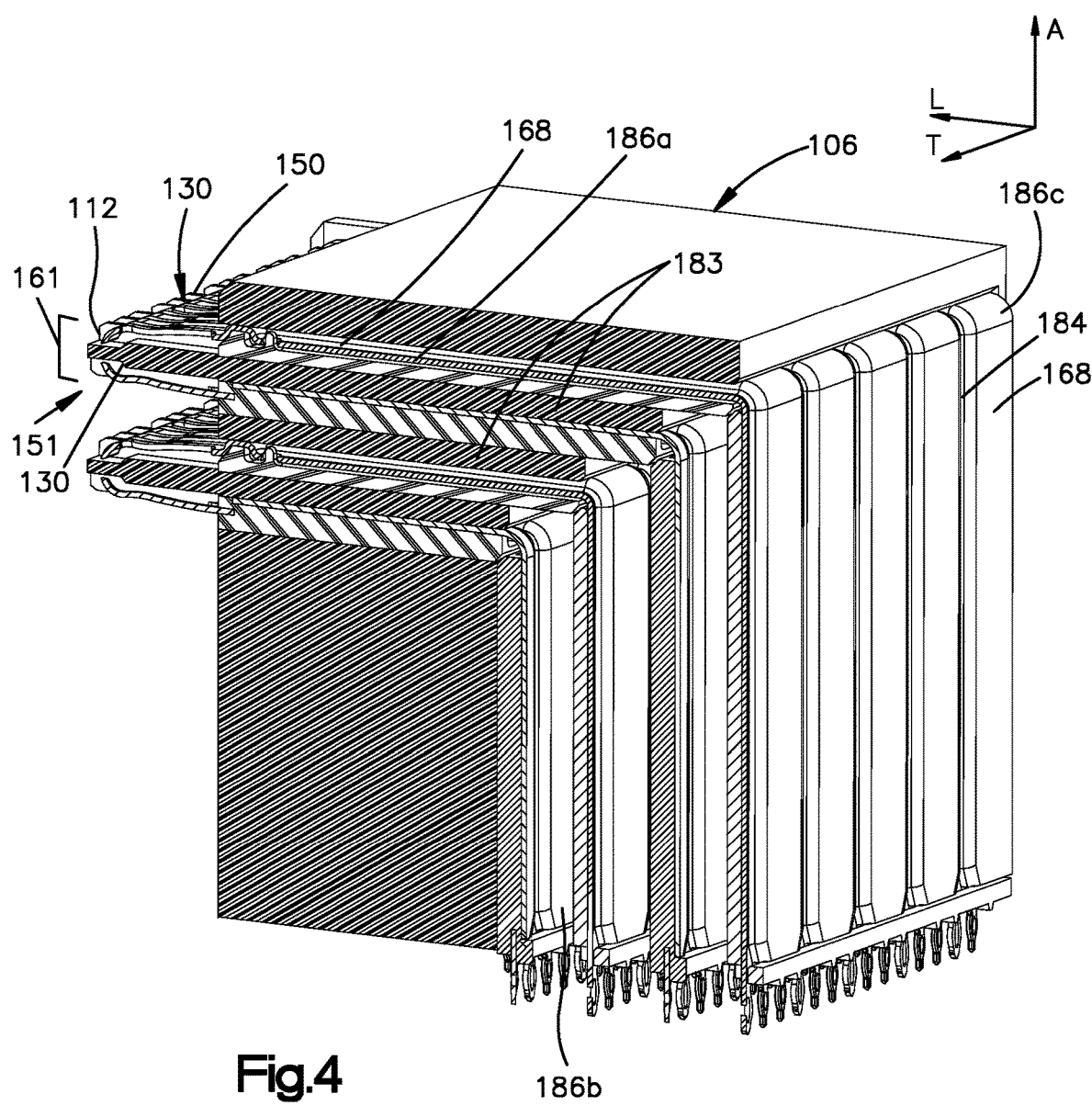
FIG. 4 is a sectional perspective view of the first electrical connector illustrated in FIG. 1.
Figure 5A:
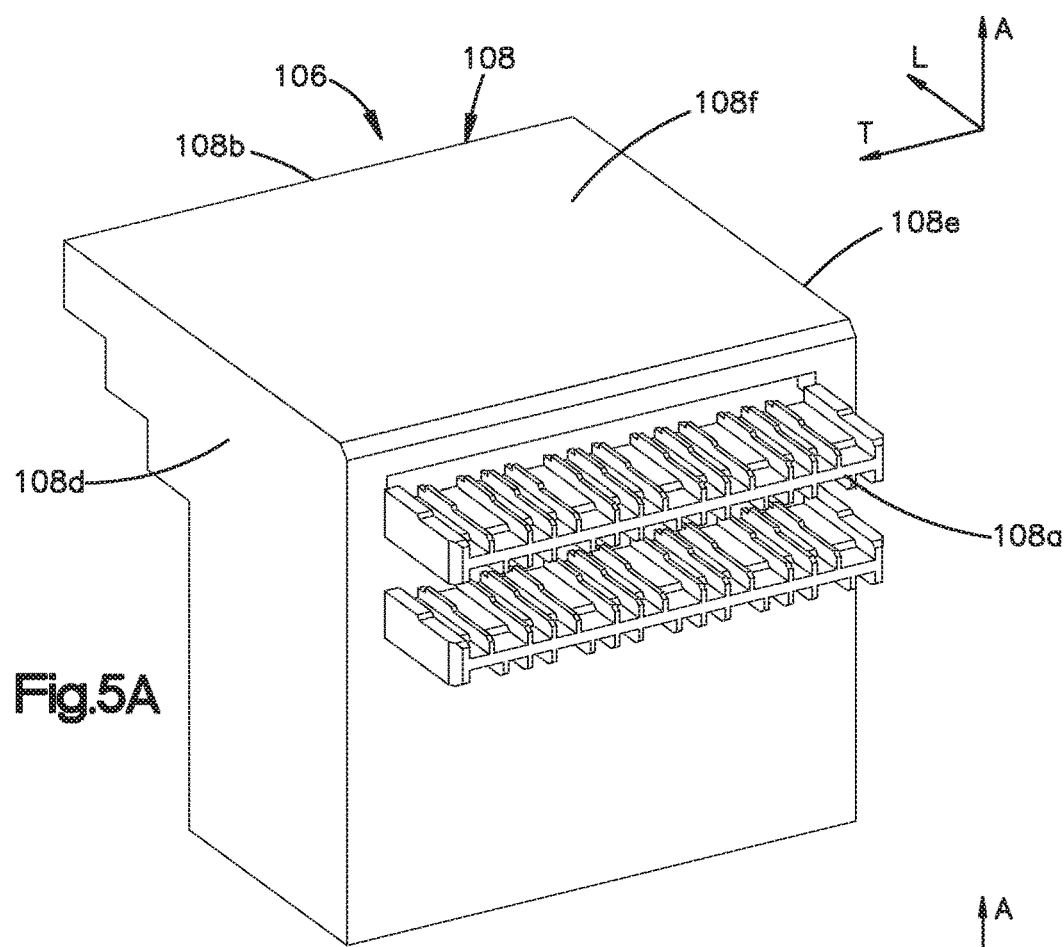
FIG. 5A is a front perspective view of the connector housing of the first electrical connector illustrated in FIG. 1.
Figure 5B:
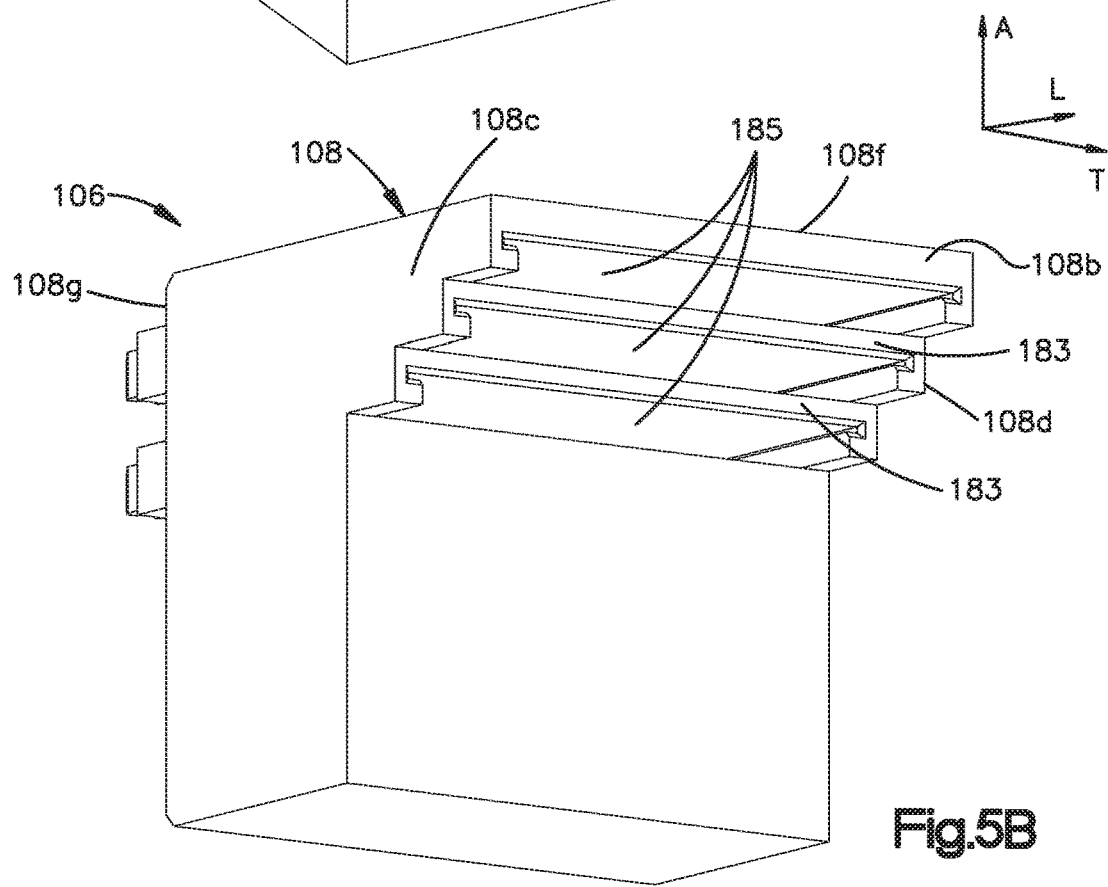
FIG. 5B is a rear perspective view of the connector housing of the first electrical connector illustrated in FIG. 1.
Figure 6:
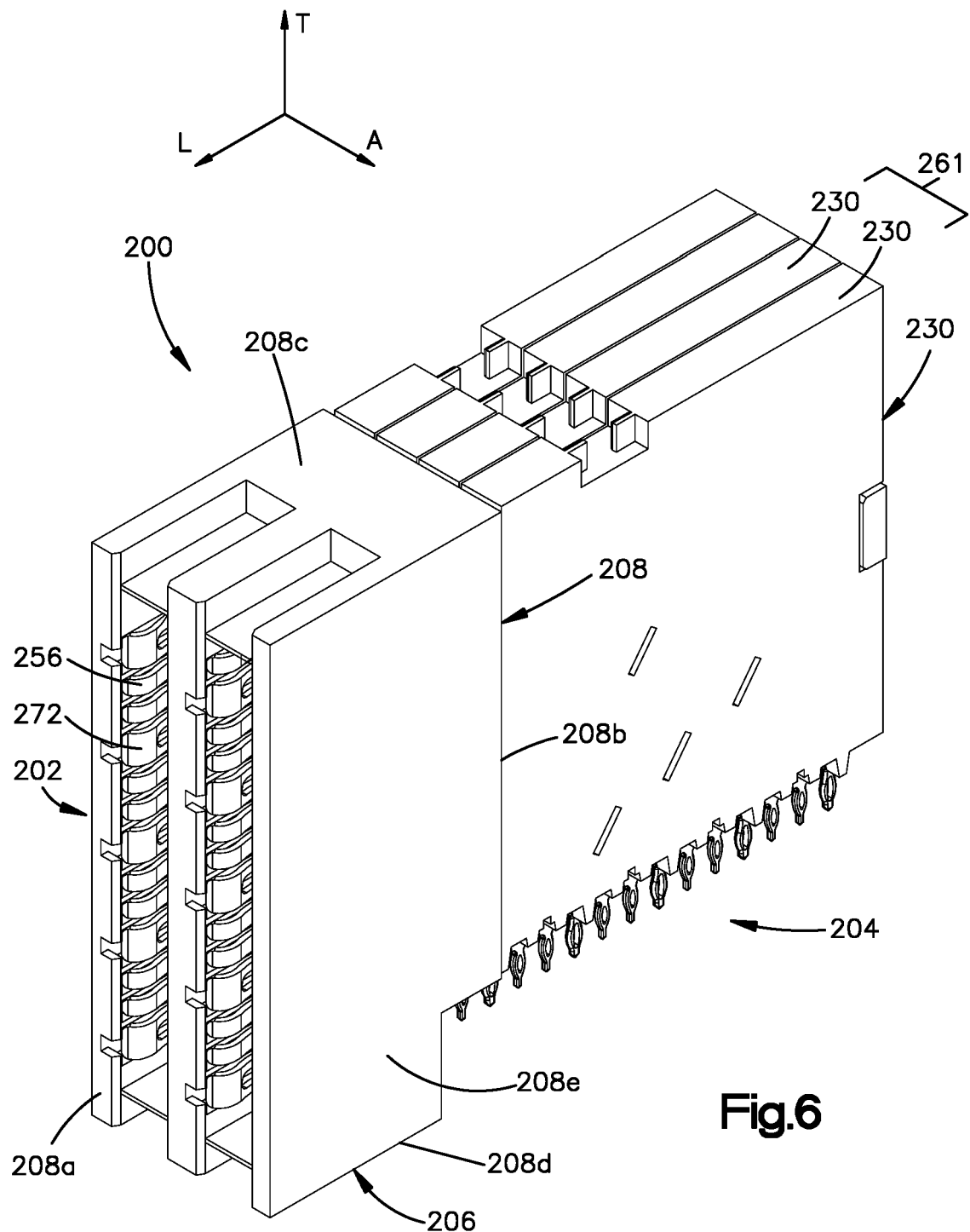
FIG. 6 is a perspective view of the second electrical connector illustrated in FIG. 1.

Referring now to FIGS. 1A-C, an orthogonal electrical connector assembly 10 can include a first electrical connector 100 and a second electrical connector 200 configured to be mated with the first electrical connector 100. The orthogonal electrical connector assembly can further include a first electrical component such as a first substrate 300a, and a second electrical component such as a second substrate 300b. The first and second substrates 300a and 300b can be configured as a first and second printed circuit boards, respectively. For instance, the first substrate 300a can be configured as a backplane, or alternatively can be configured as a midplane, daughter card, or any suitable alternative electrical component. The second substrate 300b can be configured as a daughter card, or can alternatively be configured as a backplane, a midplane, or any suitable alternative electrical component.

The first substrate 300a defines first and second opposed surfaces 301a and 301b, and a plurality of edges 302 that extend from the first surface 301a to the second surface 301b. The first and second surfaces 301a and 301b can be parallel to each other. The edges 302 can define a first outer perimeter of the first substrate 300a. The first electrical connector can be configured to be mounted to the first surface 301a of the first substrate 300a at a location such that the connector housing of the first electrical connector 10 can be recessed from an entirety of the first outer perimeter of the first substrate 300a. The first substrate 300a defines a first thickness from the first surface 301a to the second surface 301b along a plane that intersects the substrate 300a along a direction orthogonal to the substrate 300a. The first substrate 300a further defines a second distance one of the surfaces 301a and 301b from one of the edges 302 to an opposite one of the edges 302 in the plane. The second distance is greater than the first thickness. The first substrate 300a can be oriented along a first plane that is parallel to the first surface 301a at a location between the first surface 301a and the second surface 301b.

Similarly, the second substrate 300b defines first and second opposed surfaces 303a and 303b, and a plurality of edges 304 that extend from the first surface 303a to the second surface 303b. The first and second surfaces 303a and 303b can be parallel to each other. The edges 304 can define a second outer perimeter of the second substrate 300b. The second substrate 300b defines a second thickness from the first surface 303a to the second surface 303b along a plane that intersects the substrate 300b along a direction orthogonal to the substrate 300b. The second substrate 300b further defines a second distance one of the surfaces 303a and 303b from one of the edges 304 to an opposite one of the edges 304 in the plane. The second distance is greater than the second thickness. The second substrate 300b can be oriented along a second plane that is parallel to the first surface 303a at a location between the first surface 303a and the second surface 303b. When the first and second electrical connectors 100 and 200 are mated to each other and mounted to the first and second substrates 300a and 300b, respectively, the second plane can intersect the first substrate 300a.

When the first and second electrical connectors are mounted to the first surfaces of the first and second substrates 300a and 300b, respectively, one of the edges 304 of the second substrate 300b faces the first surface 301a of the first substrate 300. For instance, the one of the edges 304 of the second substrate 300b can abut the first surface 301a of the first substrate 300.

The first electrical connector 100 can be configured to be mounted to the first substrate 300a so as to place the first electrical connector 100 in electrical communication with the first substrate 300a. For instance, the first electrical connector 100 can be configured to be mounted to the first surface 301a of the first substrate 300a. Similarly, the second electrical connector 200 can be configured to be mounted to the second substrate 300b so as to place the second electrical connector 200 in electrical communication with the second substrate 300b. For instance, the second electrical connector 200 can be configured to be mounted to the first surface 303a fo the second substrate 300a. The first and second electrical connectors 100 and 200 are further configured to be mated with each other along a forward mating direction so as to place the first electrical connector 100 in electrical communication with the second electrical connector 200. The first and second electrical connectors 100 and 200 are configured to unmate from the second connector 200 along a rearward unmating direction opposite the mating direction. The mating direction can, for instance, define a longitudinal direction L. Accordingly, the first and second electrical connectors 100 and 200 can be mated to one another so as to place the first substrate 300a in electrical communication with the second substrate 300b.

In accordance with one embodiment, the first electrical connector 100 can be configured as an orthogonal connector that defines a mating interface 102 and a mounting interface 104 that is oriented substantially perpendicular with respect to the mating interface 102. The second electrical connector 200 can be constructed as a right-angle electrical connector that defines a mating interface 202 and a mounting interface 204 that is oriented substantially perpendicular to the mating interface 202. The first electrical connector 100 is configured to mate with the mating interface 202 of the second electrical connector 200 at its mating interface 102. Similarly, the second electrical connector 200 is configured to mate with the mating interface 102 of the first electrical connector 100 at its mating interface 202.33. The second mating interface 202 can be aligned with the first substrate 300a along a first or lateral direction A when the first and second electrical connectors 100 and 200 are mated to each other and the first electrical connector 100 is mounted to the first substrate 300a. The lateral direction A can be oriented perpendicular to the mating direction. Because the first and second electrical connectors are configured to directly mate with each other, the orthogonal connector assembly can be referred to as a direct mate orthogonal connector assembly. For instance, the first and second electrical connectors 100 and 200 are configured to mate with each other at their respective first and second mating interfaces 104 and 204, such that the second plane defined by the second substrate 300b is substantially perpendicular to the first plane defined by the first substrate 300a. In one example, an entirety of the second substrate 300b can be spaced from the first plane defined by the first substrate 300a. Further, at least a portion of one of the edges 304 can face the first substrate 300a. The second plane defined by the second substrate 300b can be oriented perpendicular to both the first plane defined by the first substrate 300a and the first mating interface 102 when the first and second electrical connectors 100 and 200 are mounted to the first and second substrates 30a and 300b, respectively, and mated to each other.

The first electrical connector 100 can include a dielectric, or electrically insulative connector housing 106 and a plurality of electrical contacts 150 that are supported by the connector housing 106. The plurality of electrical contacts 150 can be referred to as a first plurality of electrical contacts with respect to the electrical connector assembly 10. The connector housing 106 can include a housing body 108 that can be constructed of any suitable dielectric or electrically insulative material, such as plastic. The housing body 108 can define a front end 108a and an opposed rear end 108b that is spaced from the front end 108a along the longitudinal direction L. The housing body 108 can further define a top wall 108f and a bottom wall 108e that is spaced from the top wall 108f along a lateral direction A that is perpendicular to the longitudinal direction L. The top wall 108f can define an upper surface that defines an exterior surface of the housing body 108. The upper surface can be parallel to the mounting interface 104. The housing body 108 can further define opposed first and second sides that can be, in turn, defined by first and second side walls 108c and 108d that are spaced from each other along a transverse lateral direction T that is perpendicular to both the longitudinal direction L and the lateral direction A. The first and second side walls 108c and 108d can extend between the top and bottom walls 108f and 108e, for instance from the top wall 108f to the bottom wall 108e.

The second substrate 300b can be asymmetrically positioned with respect to the first and second opposed sides 108c and 108d when the second electrical connector 200 is mounted to the second substrate 300b, and the second electrical connector 200 is mated to the first electrical connector 100. Further, in one example, the outer perimeter of the second substrate 200 does not extend above the upper surface 108f of the first electrical connector 100 when the second electrical connector 200 is mounted to the second substrate 300b and mated to the first electrical connector 100. For instance, a first one of the edges 304 of the second substrate 300b can face, or abut, the first surface 301a of the first substrate. The second substrate 300b can define a height that extends from the first one of the edges to a second one of the edges 304 opposite the first one of the edges 304 with respect to the lateral direction. In one example, the height is no greater than a height from the first mounting 104 interface to the upper surface 108f of the first electrical connector 100. Further still, in one example, neither of the first and second opposed sides of the first electrical connector 100 defines the mating interface 102. Rather, the front end 108a of the connector housing 106 can define the mating interface 102. Further, the first mating interface 102 can be disposed between the mounting interface 104 and the upper surface 108f, and can be further disposed between the first and second opposed sides 108c and 108d.

The first mating interface 104 can be disposed between a midline and the upper surface of the top wall 108f of the connector housing 106 with respect to the lateral direction A, where the midline is disposed midway between the mounting interface 104 and the upper surface 108f with respect to the lateral direction A. For instance, the mating interface 104 can be disposed immediately adjacent the upper surface 108f. Further, the mating interface 102 can extend out from the first connector housing 108. Thus, the first electrical connector 100 defines an upside-down L-shape in side view when the first electrical connector 100 is oriented so as to mount to the first substrate 300a while the first substrate 300a is disposed below the first electrical connector 100.

Referring now to FIGS. 8A-8F generally, at least one of the first and second substrates 300a and 300b can define an air ventilation opening 305 that allows air to travel from one side of the second substrate 300b on one side of the second plane defined by the second substrate 300b, to a second side of the second substrate 300b on another side of the second plane opposite the one side. As illustrated in FIG. 8A, the at least one air ventilation opening 305 can extend through the second substrate from the respective first surface to the second surface. The air ventilation opening can be tapered in a direction from the first surface 303a to the second surface 303b. Thus, the at least one air ventilation opening 305 can define a first cross-sectional area at the first surface, and a second cross-sectional area at the second surface that is less than the first cross-sectional area. Alternatively or additionally, as illustrated in FIG. 8B, the air ventilation opening 305 can be tapered in a direction from the second surface 303b to the first surface 303a. Thus, the at least one air ventilation opening 305 can define a first cross-sectional area at the first surface, and a second cross-sectional area at the second surface that is greater than the first cross-sectional area. The tapered opening 305 can create a venturi effect that facilitates airflow through the air ventilation opening 305 and over the electrical components of the electrical connector assembly 10. Referring to FIG. 8C, the first substrate 300a can alternatively or additionally define comprises at least one projection 306, such as a plurality of projections 306, that extends out from the first surface 301a, thereby at least partially defining the at least one air ventilation opening 305. For instance, the air ventilation opening 305 can be defined between adjacent ones of the projections 306. The one of the edges 304 of the second substrate 303b can face the at least one projection such that the air ventilation opening 305 facilitates airflow across the second substrate 300b as described above. For instance the one of the edges 304 can abut the at least one projection 306.

Alternatively or additionally still, referring to FIG. 8D, the first substrate 300a can define at least one recess 307 in the first surface 301a toward the second surface 301b so as to define the at least one air ventilation opening 305. The one of the edges 304 of the second substrate 303b faces the at least one recess 307. The at least one recess can have a length greater than a thickness of the second substrate 300b from the first surface 303a to the second surface 303b so as to facilitate airflow across the second substrate 300b as described above. Alternatively or additionally still, referring to FIG. 8E, the second substrate 300b can defines at least one projection 308, such as a plurality of projections 308, that extends out from the one of the edges 304 and faces the first surface 301a of the first substrate 300a. The at least one ventilation opening 305 can be at least partially defined by the at least one projection 308. For instance, the at least one ventilation opening 305 can be defined between a pair of the projections 308. The at least one projection 308 can abut the first surface 301a of the first substrate 300a, or can be spaced from the first surface 301a, such that the first surface 301a faces the at least one projection 308. Alternatively or additionally still, referring to FIG. 8F, the second substrate 300b can define at least one recess 309 that extends in from the one of the edges 304 so as to define the at least one air ventilation opening 305. The one of the edges 304 can face the first surface 301a of the first substrate 300a. For instance, the one of the edges 304 can be spaced from the first surface 301a or can abut the first surface 301a.

Referring to FIGS. 1-5B, the mating interface 102 can be disposed adjacent the front end 108a of the housing body 108 in the manner described above. The mounting interface 104 can be disposed adjacent bottom wall 108e of the housing body 108. As described above, the first electrical connector 100 can include a plurality of electrical contacts 150 supported by the connector housing 106. The plurality of electrical contacts 150 can include a first plurality of signal contacts 152 and a first at least one ground contact 154. For instance, the first electrical connector 100 can include a plurality of leadframe assemblies 130 that include select ones of the plurality of electrical signal contacts 152 and at least one ground contact 154. The leadframe assemblies 130 can be supported by the connector housing 106 such that they are spaced from each other along a row direction, which can be defined by the lateral direction A. The electrical contacts 150 of each leadframe assembly 130 can be arranged along a column direction, which can be defined by the transverse direction T.

The electrical signal contacts 152 can define respective mating ends 156 that extend along the mating interface 102, and mounting ends 158 that extend along the mounting interface 104. The mating ends 156 and the mounting ends 158 of each signal contact 152 can be aligned with each other along a respective plane that is defined by the lateral direction A and the longitudinal direction L. The respective planes defined by the signal contacts 152 of each leadframe assembly 130 can be spaced from each other along the transverse direction T. The at least one ground contact 154 can define ground mating ends 172 that extend along the mating interface 102, and ground mounting ends 174 that extend along the mounting interface 104 and can be in electrical communication with the ground mating ends 172. Thus, it can be said that the electrical contacts 150 can define mating ends, which can include the mating ends 156 of the electrical signal contacts 152 and the ground mating ends 172. The electrical contacts 150 can further define mounting ends, which can include the mounting ends 158 of the electrical signal contacts 152 and the ground mounting ends 174. The mounting ends 158 and the ground mounting ends 174 can be configured as press-fit tails, surface mount tails, fusible elements such as solder balls, or combinations thereof, which are configured to electrically connect to a complementary electrical component such as the first substrate 300a. As will be appreciated from the description below, the at least one ground contact 154, including the ground mating ends 172 and the ground mounting ends 174, can be defined by a ground plate 168 of the respective leadframe assembly 130. The ground plate 168 can be electrically conductive as desired. Alternatively, the ground mating ends 172 and ground mounting ends 174 can be defined by respective individual ground contacts as desired. The mating interface 104 can define a matrix of the mating ends of the electrical contacts 150. The matrix can be fully contained between the midline described above and the upper surface 108f with respect to the lateral direction A. For instance, the matrix of mating ends of the electrical contacts 150 can be disposed immediately adjacent the upper surface 108f.

The mating ends of the electrical contacts 150 can lie out-of-plane with respect to the mounting ends of the electrical contacts 150. For instance, the mating ends of the electrical contacts 150 of each leadframe assembly 130 can lie in a first plane, the mounting ends of the electrical contacts 150 of the respective leadframe assembly can lie in a second plane, and the second plane and the first plane can be orthogonal with respect to each other. In accordance with the illustrated embodiment, the first plane is defined by the transverse direction T and the longitudinal direction L, and the second plane is defined by the transverse direction T and the lateral direction A.

The electrical connector 100 can include as many leadframe assemblies 130 as desired, such as four in accordance with the illustrated embodiment. In accordance with one embodiment, each leadframe assembly 130 can include a dielectric, or electrically insulative, leadframe housing 132 and a plurality of the electrical contacts 150 that are supported by the leadframe housing 132. In accordance with the illustrated embodiment, each leadframe assembly 130 includes a plurality of the signal contacts 152 that are supported by the leadframe housing 132 and a ground contact 154 that can be configured as a ground plate 168. The signal contacts 152 can be overmolded by the dielectric leadframe housing 132 such that the leadframe assemblies 130 are configured as insert molded leadframe assemblies (IMLAs), or can be stitched into or otherwise supported by the leadframe housing 132. The ground plate 168 can be attached to the leadframe housing 132.

The ground plate 168 includes a plate body 170 and a plurality of ground mating ends 172 that extend out from the plate body 170. For instance, the ground mating ends can extend forward from the plate body 170 along the longitudinal direction L. The ground mating ends 172 can thus be aligned along the transverse direction T. The ground plate 168 further includes a plurality of ground mounting ends 174 that extend out from the plate body 170. For instance, the ground mounting ends 174 can extend from the plate body 170 along the lateral direction A. Thus, the ground mating ends 172 and the ground mounting ends 174 can be oriented substantially perpendicular with respect to each other. The ground mating ends 172 can be configured to electrically connect to complementary ground mating ends of a complementary electrical connector, such as the second electrical connector 200. The ground mounting ends 174 can be configured to electrically connect to electrical traces of a substrate, such as the first substrate 300a.

Each ground mating end 172 can be constructed as a receptacle ground mating end that defines a bent, such as curved, tip 180 that can define a free end of the ground mating end. Similarly, each mating end 156 can be constructed as a receptacle ground mating end that defines a bent, such as curved, tip 164 that can flare outward along the lateral direction A as the electrical signal contact 152 extends along the mating direction. The distal tip 164 can define a free end of the signal contact 152. Bent structures as described herein refer to bent shapes that can be fabricated, for instance, by bending the end or by stamping a bent shape, or by any other suitable manufacturing process. Because the mating ends 156 of the signal contacts 152 and the ground mating ends 172 are provided as receptacle mating ends and receptacle ground mating ends, respectively, the first electrical connector 100 can be referred to as a receptacle connector as illustrated. One or more up to all of adjacent differential signal pairs 166 can be separated from each other along the transverse direction T by a gap 159. Otherwise stated, the electrical signal contacts 152 as supported by the leadframe housing 132 can define a gap 159 disposed between adjacent differential signal pairs 166. The ground mating ends 172 are configured to be disposed in the gap 159 between the mating ends 156 of the electrical signal contacts 152 of each differential signal pair 166. Similarly, the ground mounting ends 174 are configured to be disposed in the gap 159 between the mounting ends 158 of the electrical signal contacts 152 of each differential signal pair 166 when the ground plate 168 is attached to the leadframe housing 132.

Each leadframe assembly 130 can further include an engagement assembly that is configured to attach the ground plate 168 to the leadframe housing 132. The leadframe housing 132 can define a recessed region 195 that extends into the leadframe housing body 157 along the lateral direction A. For instance, the recessed region 195 can extend into a first surface and terminate without extending through a second surface that is opposite the first surface along the lateral direction A. Thus, the recessed region 195 can define a recessed surface 197 that is disposed between the first and second surfaces of the leadframe housing body 157 along the lateral direction A. The recessed surface 197 and the first surface of the leadframe housing body 157 can cooperate to define the external surface of the leadframe housing 132 that faces the ground plate 168 when the ground plate 168 is attached to the leadframe housing 132.

The leadframe assembly 130 can further include a lossy material, or magnetic absorbing material. For instance, the ground plate 168 can be made of any suitable electrically conductive metal, any suitable lossy material, or a combination of electrically conductive metal and lossy material. Thus, the ground plate 168 can be electrically conductive, and thus configured to reflect electromagnetic energy produced by the electrical signal contacts 152 during use, though it should be appreciated that the ground plate 168 can alternatively be configured to absorb electromagnetic energy. The lossy material can be any suitable magnetically absorbing material, and can be either electrically conductive or electrically nonconductive. For instance the ground plate 168 can be made from one or more ECCOSORB® absorber products, commercially available from Emerson & Cuming, located in Randolph, Mass. The ground plate 168 can alternatively be made from one or more SRC PolyIron® absorber products, commercially available from SRC Cables, Inc, located in Santa Rosa, Calif. Electrically conductive or electrically nonconductive lossy material can be coated, for instance injection molded, onto the opposed first and second plate body surfaces of the ground plate body 170 that carry ribs 184 as described below. Alternatively, electrically conductive or electrically nonconductive lossy material can be formed, for instance injection molded, to define a lossy ground plate body 170 of the type described herein. The ground mating ends 172 and the ground mounting ends 174 can be attached to the lossy ground plate body 170 so as to extend from the lossy ground plate body 170 as described herein. Alternatively, the lossy ground plate body 170 can be overmolded onto the ground mating ends 172 and the ground mounting ends 174. Alternatively still, when the lossy ground plate body 170 is nonconductive, the lossy ground plate 168 can be devoid of ground mating ends 172 and ground mounting ends 174.

At least a portion, such as a projection, of each of the plurality of ground plates 168 can be oriented out of plane with respect to the plate body 170. For example, the ground plate 168 can include at least one rib 184, such as a plurality of ribs 184 supported by the ground plate body 170. In accordance with the illustrated embodiment, each of the plurality of ribs 184 can be stamped or embossed into the plate body 170, and are thus integral and monolithic with the plate body 170. Thus, the ribs 184 can further be referred to as embossments. Accordingly, the ribs 184 can define projections that extend out from a first surface of plate body 170 along the lateral direction A, and can further define a plurality of recesses that extend into a second plate body surface opposite the first plate body surface along the lateral direction A. The ribs 184 define respective enclosed outer perimeters that are spaced from each other along the ground plate body 170. Thus, the ribs 184 are fully contained in the ground plate body 170.

The recessed regions 195 of the leadframe housing 132 can be configured to at least partially receive the ribs 184 when the ground plate 168 is attached to the leadframe housing 132. The ribs 184 can be spaced apart along the transverse direction T, such that each rib 184 is disposed between a respective one of the ground mating ends 172 and a corresponding one of the ground mounting ends 174 and is aligned with the corresponding ground mating and mounting ends 172 and 174 along the longitudinal direction L. The ribs 184 can be elongate along the longitudinal direction L between the ground mating ends 172 and the ground mounting ends 174.

The ribs 184 can extend from the ground plate body 170, for instance from the first surface of the plate body 170, a distance along the lateral direction A sufficient such that a portion of each rib 184 extends into a plane that is defined by at least a portion of the electrical signal contacts 152. The plane can be defined by the longitudinal and transverse directions L and T. For instance, a portion of each rib can define a flat that extends along a plane that is co-planar with a surface of the ground mating ends 172, and thus also with a surface of the mating ends 156 of the signal contacts 152 when the ground plate 168 is attached to the leadframe housing 132. Thus, an outermost surface of the ribs 184 that is outermost along the lateral direction A can be said to be aligned, along a plane that is defined by the longitudinal direction L and the transverse direction T, with respective outermost surfaces of the ground mating ends 172 and the mating ends 156 of the signal contacts 152 along the lateral direction A The ribs 184 are aligned with the gaps 159 along the longitudinal direction L, such that the ribs 184 can extend into the recessed region 195 of the leadframe housing 132, when the ground plate 168 is attached to the leadframe housing 132. In this respect, the ribs 184 can operate as ground contacts within the leadframe housing 132. It should be appreciated that the ground mating ends 172 and the ground mounting ends 174 can be positioned as desired on the ground plate 168, such that the ground plate 168 can be constructed for inclusion in the first or the second leadframe assembly as described above. Further, while the ground contacts 154 can include the ground mating ends 172, the ground mounting ends 174, the ribs 184, and the ground plate body 170, it should be appreciated that the ground contacts 154 can comprise individual discrete ground contacts that each include a mating end, a mounting end, and a body that extends from the mating end to the mounting end in lieu of the ground plate 168.

It should be appreciated that the leadframe assembly 130 is not limited to the illustrated ground contact 154 configuration. For example, in accordance with alternative embodiments the leadframe assembly 130 can include discrete ground contacts supported by the leadframe housing 132 as described above with respect to the electrical signal contacts 152. The ribs 184 can be alternatively constructed to contact the discrete ground contacts within the leadframe housing 132. Alternatively, the plate body 170 can be substantially flat and can be devoid of the ribs 184 or other embossments, and the discrete ground contacts can be otherwise electrically connected to the ground plate 168 or electrically isolated from the ground plate 168.

The signal contacts 152 can be constructed as right-angle contacts, whereby the mating ends 156 and the mounting ends 158 are oriented substantially perpendicular to each other. Each signal contact 152 can define a pair of opposed broadsides and a pair of opposed edges that extend between the opposed broadsides. At the mating interface 102, each of the opposed broadsides can be spaced apart from each other along the lateral direction A a first distance. At the mating interface, each of the opposed edges can be spaced apart from each other along a transverse direction T a second distance that is greater than the first distance. At the mounting interface 104, each of the opposed broadsides can be spaced apart from each other along the longitudinal direction L the first distance. At the mating interface, each of the opposed edges can be spaced apart from each other along the transverse direction T the second distance. Thus, the broadsides can define a length between the opposed edges, and the edges can define a length between the opposed broadsides. Otherwise stated, the edges and the broadsides can define respective lengths in a plane that is oriented substantially perpendicular to both the edges and the broadsides. The length of the broadsides is greater than the length of the edges. The signal contacts 152 of each leadframe assembly 130 can be can be positioned edge-to-edge, such that the respective edges of adjacent ones of the signal contacts 152 face each other.

The electrical contacts 150 can be arranged such that adjacent ones of the electrical signal contacts 152 along the column direction can define pairs 166. Each pair 166 of electrical signal contacts 152 can define a differential signal pair. Further, one of the edges of each electrical signal contacts 152 of each pair 166 can face one of the edges of the other electrical signal contact 152 of the respective pair 166. Thus, the pairs 166 can be referred to as edge-coupled differential signal pairs. The electrical contacts 150 can include a ground mating end 172 that is disposed between immediately adjacent ones of the pairs 166 of electrical signal contacts 152 along the column direction. The electrical contacts 150 can include a ground mounting end 174 that is disposed between the mounting ends 156 of immediately adjacent ones pairs 166 of electrical signal contacts 152 along the column direction. Immediately adjacent can refer to the fact that there are no additional differential signal pairs, or signal contacts, between the immediately adjacent differential signal pairs 166.

It should be appreciated that the mating ends of the electrical contacts 150 of each leadframe assembly 130 can be spaced from each other along respective linear arrays 151 that extend along the transverse direction T at the mating interface 102. The linear arrays 151 are spaced from each other along the lateral direction A at the mating interface 102. The linear arrays 151 are oriented substantially parallel to the mounting interface 104, and are accordingly also substantially parallel to the first substrate 300a to which the first electrical connector 100 is mounted. Further, it should be appreciated that the first electrical connector 100 is symmetrical, and can be used in a 90 degree orthogonal application or a 270 degree orthogonal application. In other words, the first electrical connector 100 can be selectively oriented 90 degrees with respect to the second electrical connector 200 in both a clockwise or a counterclockwise direction from a neutral position to respective first or second positions, and subsequently mated to the second electrical connector in either the first or the second position. The electrical contacts 150 can be spaced from each other along in a first direction, such as the column direction, along the linear array 151 from a first end to a second end, and a second direction that is opposite the first direction from the second end to the first end along the linear array. Both the first and second directions thus extend along the column direction. In accordance with the illustrated embodiment, the mating ends 156 of the signal contacts 152 and the ground mating ends 172 can be aligned along the linear array 151, and thus along the transverse direction T, at the mating interface 102. Further, the mounting ends 158 of the signal contacts 152 and the ground mounting ends 174 can be aligned along the linear array 151, and thus along the transverse direction T at the mounting interface 104.

The electrical contacts 150, including the mating ends 156 and ground mating ends 172, and further including the mounting ends 158 and ground mounting ends 174, can define any repeating contact pattern as in each of the desired in the first direction, including S-S-G, G-S-S, S-G-S, or any suitable alternative contact pattern, where "S" represents an electrical signal and "G" represents a ground. Furthermore, the electrical contacts 150 of the leadframe assemblies 130 that are adjacent each other along the row direction can define different contact patterns. In accordance with one embodiment, the leadframe assemblies 130 can be arranged pairs 161 of adjacent first and second leadframe assemblies, respectively that are adjacent each other along the row direction. The electrical contacts 150 of the first leadframe assemblies are arranged along first linear arrays 151 at the mating ends. The electrical contacts 150 of the first leadframe assemblies are arranged along second linear arrays 151 at the mating ends. The first leadframe assembly can define a first contact pattern in the first direction, and the second leadframe assembly can define a second contact pattern in the first direction that is different than the first contact pattern of the first leadframe assembly.

Each of the first and second linear arrays 151 can include a ground mating end 172 adjacent the mating ends 156 of every differential signal pair 166 of each of the respective linear array 151 along both the first and the second directions. Thus, the mating ends 156 of every differential signal pair 166 can be flanked on opposite sides along the respective linear array by a respective ground mating end 172. Similarly, each of the first and second linear arrays 151 can include a ground mounting end 174 adjacent the mounting ends 154 of every differential signal pair 166 of each of the respective linear array 151 along both the first and the second directions. Thus, the mounting ends 154 of every differential signal pair 166 is flanked on opposite sides along the respective linear array by a respective ground mounting end 174.

For instance, the first leadframe assembly can define a repeating contact pattern of G-S-S along the first direction, such that the last electrical contact 150 at the second end of the linear array 151, which can be the lowermost end, is a single widow contact 152a that can be overmolded by the leadframe housing or stitched into the leadframe housing as described with respect to the electrical signal contacts 152. The second leadframe assembly 130 can define a repeating contact pattern of G-S-S along the second direction, such that the last electrical contact 150 at the first end of the linear array, which can be an uppermost end, of the linear array is a single widow contact 152a. It should be appreciated for the purposes of clarity that reference to the signal contacts 152 includes the single widow contacts 152. The single widow contacts 152a can be single-ended signal contacts, low speed or low frequency signal contacts, power contacts, ground contacts, or some other utility contacts.

The leadframe assemblies 130 are spaced from each other along the lateral direction A at the mating interface 102, and along the longitudinal direction L at the mounting interface 104. The mating ends 156 of the signal contacts 152 and the ground mating ends 172 of each leadframe assembly 130 are spaced apart along the linear array 151, or the transverse direction T, and the mounting ends 158 of the signal contacts 152 and the ground mounting ends 174 of each leadframe assembly 130 are also spaced apart along the same transverse direction T. One of a pair of adjacent ones of the leadframe assemblies 130 can be nested within the other of the pair of adjacent ones of the leadframe assemblies 130, such that the electrical contacts 150 of the other of the pair of adjacent ones of the leadframe assemblies 130 are disposed outward, for instance along the longitudinal direction L and the lateral direction A, with respect to the electrical contacts 150 of the one of the pair of adjacent ones of the leadframe assemblies 130.

The connector housing 106 can be made from any suitable dielectric material, and can include a plurality of divider walls 183 that are spaced from each other along the lateral direction A, and can be substantially planar along the longitudinal direction L and transverse direction T. The connector housing 106 defines complementary pockets 185 disposed between adjacent ones of the divider walls 183. Each of the pockets 185 can be sized to receive at least a portion of respective ones of the leadframe assemblies 130 along the longitudinal direction L, such that the mating ends 156 of the signal contacts 152 and the ground mating ends 172 extend forward from the respective pocket 185. In particular, the leadframe assemblies 130, including the ground plate 168 and the leadframe housing 132, can be bent so as to define a mating portion 186a, a mounting portion 186b, and a ninety degree bent region 186c that separates the mating portion 186a from the mounting portion 186b, such that the mating and mounting portions 186a and 186b are oriented substantially perpendicular with respect to each other. The bent region 186c can be bent about an axis that is substantially parallel to the linear array 151.

The mating portion 186a of respective ones of the leadframe assemblies 130 can define a length along the longitudinal direction L between the bent region 186c and the mating ends of the electrical contacts 150. The length of the respective ones of the leadframe assemblies 130 can increases as the position of the mating and mounting portions of each leadframe assembly 130 are further spaced from the mating interface 102 and mounting interface 104, respectively, with respect to the other ones of the leadframe assemblies 130. Furthermore, the mounting portions 186b of respective ones of the leadframe assemblies 130 can define a length along the lateral direction A between the bent region 186c and the mounting ends of the electrical contacts 150. The length of the respective ones of the leadframe assemblies 130 can increase as the position of the mating and mounting portions of each leadframe assembly 130 are further spaced from the mating interface 102 and mounting interface 104. It should thus further be appreciated that the bent regions 186c of the leadframe assemblies 130 are increasingly spaced from both the mating interface 102 and the mounting interface 104 as the leadframe assemblies 130 are further spaced from the mating interface 102 and the mounting interface 104, respectively.

Referring now to FIGS. 1 and 6-7B, the second electrical connector 200 can include a dielectric, or electrically insulative connector housing 206 and a plurality of electrical contacts 250 that are supported by the connector housing 206. Thus, the second electrical connector 200 can be devoid of a cable. The plurality of electrical contacts 250 can be referred to as a second plurality of electrical contacts with respect to the electrical connector assembly 10. Each of the second plurality of electrical contacts 250 can include a second plurality of signal contacts 252 and a second at least one ground contact 254, such as a second plurality of ground contacts 254. The second electrical connector 200 can include a plurality of leadframe assemblies 230 that are supported by the connector housing 206 and arranged along a row direction. The row direction can be defined by the lateral direction A. The second electrical connector 200 can include as many leadframe assemblies 230 as desired, such as four in accordance with the illustrated embodiment.

Each leadframe assembly 230 can include a dielectric, or electrically insulative, leadframe housing 232 and select ones of the plurality of electrical signal contacts 252 and at least one ground contact 254. The signal contacts 252 can be overmolded by the dielectric leadframe housing 232 such that the leadframe assemblies 230 are configured as insert molded leadframe assemblies (IMLAs), or can be stitched into or otherwise supported by the leadframe housing 232. The ground plate 268 can be attached to the leadframe housing 232. The electrical signal contacts 252 can define respective mating ends 256 that extend along the mating interface 202, and mounting ends 258 that extend along the mounting interface 204. Each at least one ground contact 254 can define respective ground mating ends 272 that extend along the mating interface 202, and ground mounting ends 274 that extend along the mounting interface 204. The mounting ends 258 and the ground mounting ends 274 can be configured as press-fit tails, surface mount tails, or fusible elements such as solder balls, which are configured to electrically connect to a complementary electrical component such as the second substrate 300b.

Thus, it can be said that the electrical contacts 250 can define mating ends, which can include the mating ends 256 of the electrical signal contacts 252 and the ground mating ends 272, and the electrical contacts 250 can further define mounting ends, which can include the mounting ends 258 of the electrical signal contacts 252 and the ground mounting ends 274. The second mating interface 202 can define a second matrix of mating ends of the electrical contacts 250, and the second matrix can be fully contained between the midline of the first connector housing 106 and the upper surface 108f of the first connector housing 106 with respect to the lateral direction A when the first and second electrical connectors 100 and 200 are mated to each other. As will be appreciated from the description below, each ground contact 254, including the ground mating ends 272 and the ground mounting ends 274, can be defined by a ground plate 268 of respective ones of the leadframe assemblies 230. Alternatively, the ground mating ends 272 and ground mounting ends 274 can be defined by individual ground contacts as desired.

The ground plate 268 includes a plate body 270 and a plurality of ground mating ends 272 that extend out from the plate body 270. For instance, the ground mating ends can extend forward from the plate body 270 along the longitudinal direction L. The ground mating ends 272 can thus be aligned along the transverse direction T. The ground plate 268 further includes a plurality of ground mounting ends 274 that extend out from the plate body 270. For instance, the ground mounting ends 274 can extend down from the plate body 270, perpendicular to the ground mating ends 272, along the transverse direction T. Thus, the ground mating ends 272 and the ground mounting ends 274 can be oriented substantially perpendicular to each other. It should be appreciated, of course, that the ground plate 268 can be configured to attach to a vertical leadframe housing, such that the ground mating ends 272 and the ground mounting ends 274 are oriented substantially parallel with each other. The ground mating ends 272 can be configured to electrically connect to complementary ground mating ends of a complementary electrical connector, such as the ground mating ends 172 of the first electrical connector 100. The ground mounting ends 274 can be configured to electrically connect to electrical traces of a substrate, such as the second substrate 300b.

The electrical contacts 250 can be constructed as right-angle contacts, whereby the mating ends 256 and the mounting ends 258 are oriented substantially perpendicular to each other. Similarly, the ground mating ends 272 and the ground mounting ends 274 can be oriented perpendicular to each other. The mounting ends 258 and the ground mounting ends 274 can be provided as press-fit tails, surface mount tails, fusible elements such as solder balls, or combinations thereof, which are configured to electrically connect to a complementary electrical component such as the second substrate 300b.

The connector housing 206 can include a housing body 208 that can be constructed of any suitable dielectric or electrically insulative material, such as plastic. The housing body 208 can define a front end 208a and an opposed rear end 208b that is spaced from the front end 208a along the longitudinal direction L. The housing body 208 can further include a top wall 208c and a bottom wall 208d that is spaced from the top wall 208c along the transverse direction T. The housing body 208 can further include opposed first and second side walls 208e and 208f that are spaced from each other along the lateral direction A. The first and second side walls 208e and 208f can extend between the top and bottom walls 208c and 208d, for instance from the top wall 208c to the bottom wall 208d. The first and second side walls 208e and 208f can further extend from the rear end 208b of the housing body 208 to the front end 208a of the housing body 208. One of the first and second sides can be substantially flush with the upper surface of the first electrical connector 100 when the first electrical connector 100 is mated to the second electrical connector 200. The front end 208a can lie in a plane that is defined by the lateral direction A and the transverse direction T. The illustrated housing body 208 is constructed such that the mating interface 202 is spaced forward with respect to the mounting interface 204 along the mating direction. The housing body 208 can further define a void, such that the leadframe assemblies 230 are disposed in the void when they are supported by the connector housing 206. In accordance with the illustrated embodiment, the void can be defined by the top and bottom walls 208c and 208d, and the first and second side walls 208e and 208f.

Each signal contact 252 can define a pair of opposed broadsides and a pair of opposed edges that extend between the opposed broadsides. Each of the opposed broadsides can be spaced apart from each other along the lateral direction A, and thus the row direction, a first distance. Each of the opposed edges can be spaced apart from each other along the transverse direction T a second distance that is greater than the first distance. Thus, the broadsides can define a length between the opposed edges along the transverse direction T, and the edges can define a length between the opposed broadsides along the lateral direction A. Otherwise stated, the edges and the broadsides can define respective lengths in a plane that is oriented substantially perpendicular to both the edges and the broadsides. The length of the broadsides is greater than the length of the edges.

The electrical contacts 250 can be arranged such that adjacent ones of the electrical signal contacts 252 along a column direction can define pairs 266. Each pair 266 of electrical signal contacts 252 can define a differential signal pair 266. Further, one of the edges of each electrical signal contacts 252 of each pair 266 can face one of the edges of the other electrical signal contact 252 of the respective pair 266. Thus, the pairs 266 can be referred to as edge-coupled differential signal pairs. The electrical contacts 250 can include a ground mating end 272 that is disposed between the mating ends 256 of immediately adjacent pairs 266 of electrical signal contacts 252 along the column direction. The electrical contacts 250 can include a ground mounting end 274 that is disposed between the mounting ends 258 of immediately adjacent pairs 266 of electrical signal contacts 252 along the column direction. Immediately adjacent can refer to the fact that there are no additional differential signal pairs, or signal contacts, between the immediately adjacent differential signal pairs 266.

It should be appreciated that the electrical contacts 250, including the mating ends 256 of the electrical signal contacts 252 and the ground mating ends 272, can be spaced from each other along a linear array 251 of the electrical contacts 250 that extends along the column direction. Thus, the linear array 251 and the column direction can be oriented along the transverse direction T. The linear array 251 can be defined by the respective leadframe assembly 230. For instance, the electrical contacts 250 can be spaced from each other along in a first direction, such as the column direction, along the linear array 251 from a first end to a second end, and a second direction that is opposite the first direction from the second end to the first end along the linear array. Both the first and second directions thus extend along the column direction. The electrical contacts 250, including the mating ends 256 and ground mating ends 272, and further including the mounting ends 258 and ground mounting ends 274, can define any repeating contact pattern as in each of the desired in the first direction.

Each of the first and second linear arrays 251 can include a ground mating end 272 adjacent the mating ends 252 of every differential signal pair 266 of each of the respective linear array 251 along both the first and the second directions. Thus, the mating ends 252 of every differential signal pair 266 is flanked on opposite sides along the respective linear array by a respective ground mating end 272. Similarly, each of the first and second linear arrays 251 can include a ground mounting end 274 adjacent the mounting ends 254 of every differential signal pair 266 of each of the respective linear array 251 along both the first and the second directions. Thus, the mounting ends 254 of every differential signal pair 266 is flanked on opposite sides along the respective linear array by a respective ground mounting end 274.

At least some up to all of the leadframe assemblies 230 can be arranged in respective pairs 261 of immediately adjacent first and second respective leadframe assemblies. For instance, the first leadframe assembly can define a repeating contact pattern of G-S-S along the first direction, such that the last electrical contact 250 at the second end of the linear array 251, which can be the lowermost end, is a single widow contact 252a that can be overmolded by the leadframe housing or stitched into the leadframe housing as described with respect to the electrical signal contacts 152. The second leadframe assembly can define a repeating contact pattern of G-S-S along the second direction, such that the last electrical contact 250 at the first end of the linear array 251, which can be an uppermost end, of the linear array is a single widow contact 252a.

As described above, the second electrical connector 200 is configured to mate with and unmate from the first electrical connector 100 along a first direction, which can define the longitudinal direction L. For instance, the second electrical connector 200 is configured to mate with the first electrical connector 100 along a longitudinally forward mating direction, and can unmate from the second connector 200 along a longitudinally rearward unmating direction. Each of the leadframe assemblies 230 can be oriented along a plane defined by the first direction and a second direction, which can define the transverse direction T that extends substantially perpendicular to the first direction. The mating ends of the electrical contacts 250 of each leadframe assembly 230 are spaced from each other along the second or transverse direction T, which can define the column direction. The mounting ends of the electrical contacts 250 of each leadframe assembly 230 are spaced from each other along the longitudinal direction L. The leadframe assemblies 230 can be spaced along a third direction, which can define the lateral direction A, that extends substantially perpendicular to both the first and second directions, and can define the row direction R. As illustrated, the longitudinal direction L and the lateral direction A extend horizontally and the transverse direction T extends vertically, though it should be appreciated that these directions may change depending, for instance, on the orientation of the electrical connector assembly 10 during use. Unless otherwise specified herein, the terms "lateral," "longitudinal," and "transverse" are used to describe the orthogonal directional components of the components of the electrical connector assembly 10 being referred to.

Each ground mating end 272 can be constructed as a flexible beam, which can also referred to as a receptacle ground mating end, that defines a bent, for instance curved, tip 280. The ground mating ends 272 and the mating ends 256 of the signal contacts 252 of each leadframe assembly 230 can be aligned along the column direction in the linear array 251. One or more up to all of adjacent differential signal pairs 266 can be separated from each other along the transverse direction T by a gap 259. Otherwise stated, the electrical signal contacts 252 as supported by the leadframe housing 232 can define a gap 259 disposed between adjacent differential signal pairs 266. The ground mating ends 272 are configured to be disposed in the gap 259 between the mating ends 256 of the electrical signal contacts 252 of each differential signal pair 266. Similarly, the ground mounting ends 274 are configured to be disposed in the gap 259 between the mounting ends 258 of the electrical signal contacts 252 of each differential signal pair 266

Each leadframe assembly 230 can further include an engagement assembly that is configured to attach the ground plate 268 to the leadframe housing 232. The leadframe housing 232 can include a leadframe housing body 257. The leadframe housing 232 can define a recessed region 295 that extends into the leadframe housing body 257 along the lateral direction A. For instance, the recessed region 295 can extend into a first surface and terminate without extending through a second surface that is opposite the first surface along the lateral direction A. Thus, the recessed region 295 can define a recessed surface 297 that is disposed between the first and second surfaces of the leadframe housing body 257 along the lateral direction A. The recessed surface 297 and the first surface of the leadframe housing body 257 can cooperate to define the external surface of the leadframe housing 232 that faces the ground plate 268 when the ground plate 268 is attached to the leadframe housing 232. The protrusions 293 can extend out from the recessed region 295, for instance from the recessed surface 297 along a direction away from the second surface and toward the first surface.

The leadframe assembly 230 can further include a lossy material, or magnetic absorbing material. For instance, the ground plate 268 can be made of any suitable electrically conductive metal, any suitable lossy material, or a combination of electrically conductive metal and lossy material. The ground plate 268 can be electrically conductive, and thus configured to reflect electromagnetic energy produced by the electrical signal contacts 252 during use, though it should be appreciated that the ground plate 268 could alternatively be configured to absorb electromagnetic energy. The lossy material can be magnetically lossy, and either electrically conductive or electrically nonconductive. For instance the ground plate 268 can be made from one or more ECCOSORB® absorber products, commercially available from Emerson & Cuming, located in Randolph, Mass. The ground plate 268 can alternatively be made from one or more SRC PolyIron® absorber products, commercially available from SRC Cables, Inc, located in Santa Rosa, Calif. Electrically conductive or electrically nonconductive lossy material can be coated, for instance injection molded, onto the opposed first and second plate body surfaces of the ground plate body 270 that carry ribs 284 as described below. Alternatively, electrically conductive or electrically nonconductive lossy material can be formed, for instance injection molded, to define a lossy ground plate body 270 constructed as described herein. The ground mating ends 272 and the ground mounting ends 274 can be attached to the lossy ground plate body 270 so as to extend from the lossy ground plate body 270 as described herein. Alternatively, the lossy ground plate body 270 can be overmolded onto the ground mating ends 272 and the ground mounting ends 274. Alternatively still, when the lossy ground plate body 270 is nonconductive, the lossy ground plate 268 can be devoid of ground mating ends 272 and ground mounting ends 274.

At least a portion, such as a projection, of each of the plurality of ground plates 268 can be oriented out of plane with respect to the plate body 270. For example, the ground plate 268 can include at least one rib 284, such as a plurality of ribs 284 supported by the ground plate body 270. In accordance with the illustrated embodiment, each of the plurality of ribs 284 can be stamped or embossed into the plate body 270, and are thus integral and monolithic with the plate body 270. Thus, the ribs 284 can further be referred to as embossments. Accordingly, the ribs 284 can define projections that extend out from a first surface of plate body 270 along the lateral direction A, and can further define a plurality of recesses that extend into a second plate body surface opposite the first plate body surface along the lateral direction A. The ribs 284 define respective enclosed outer perimeters that are spaced from each other along the ground plate body 270. Thus, the ribs 284 are fully contained in the ground plate body 270. The ribs 284 can include a first and proximate to the mating interface 202 and a second end proximate to the mounting interface 204 that is substantially perpendicular with respect to the first end. The ribs 284 can be bent or otherwise curved between the first and second ends.

The recessed regions 295 of the leadframe housing 232 can be configured to at least partially receive the ribs 284 when the ground plate 268 is attached to the leadframe housing 232. The ribs 284 can be spaced apart along the transverse direction T, such that each rib 284 is disposed between a respective one of the ground mating ends 272 and a corresponding one of the ground mounting ends 274 and is aligned with the corresponding ground mating and mounting ends 272 and 274 along the longitudinal direction L. The ribs 284 can be elongate along the longitudinal direction L between the ground mating ends 272 and the ground mounting ends 274.

The ribs 284 can extend from the ground plate body 270, for instance from the first surface of the plate body 270, a distance along the lateral direction A sufficient such that a portion of each rib 284 extends into a plane that is defined by at least a portion of the electrical signal contacts 252. The plane can be defined by the longitudinal and transverse directions L and T. For instance, a portion of each rib can define a flat that extends along a plane that is co-planar with a surface of the ground mating ends 272, and thus also with a surface of the mating ends 256 of the signal contacts 252 when the ground plate 268 is attached to the leadframe housing 232. Thus, an outermost surface of the ribs 284 that is outermost along the lateral direction A can be said to be aligned, along a plane that is defined by the longitudinal direction L and the transverse direction T, with respective outermost surfaces of the ground mating ends 272 and the mating ends 256 of the signal contacts 252 along the lateral direction A The ribs 284 are aligned with the gaps along the longitudinal direction L, such that the ribs 284 can extend into the recessed region 295 of the leadframe housing 232, when the ground plate 268 is attached to the leadframe housing 232. In this respect, the ribs 284 can operate as ground contacts within the leadframe housing 232. It should be appreciated ground mating ends 272 and the ground mounting ends 274 can be positioned as desired on the ground plate 268, such that the ground plate 268 can be constructed for inclusion in the first or the second leadframe assembly as described above. Further, while the ground contacts 254 can include the ground mating ends 272, the ground mounting ends 274, the ribs 284, and the ground plate body 270, it should be appreciated that the ground contacts 254 can comprise individual discrete ground contacts that each include a mating end, a mounting end, and a body that extends from the mating end to the mounting end in lieu of the ground plate 268.

It should be appreciated that the leadframe assembly 230 is not limited to the illustrated ground contact 254 configuration. For example, in accordance with alternative embodiments the leadframe assembly 230 can include discrete ground contacts supported by the leadframe housing 232 as described above with respect to the electrical signal contacts 252. The ribs 284 can be alternatively constructed to contact the discrete ground contacts within the leadframe housing 232. Alternatively, the plate body 270 can be substantially flat and can be devoid of the ribs 284 or other embossments, and the discrete ground contacts can be otherwise electrically connected to the ground plate 268 or electrically isolated from the ground plate 268.

It should be appreciated that a select differential signal pair 266 of the second linear array 251 can define a victim differential signal pair that can be positioned adjacent aggressor differential signal pairs 266 that can be disposed adjacent the victim differential signal pair. For instance, ones of aggressor differential signal pairs 266 can be disposed along the second linear array and spaced from the victim differential signal pair along the transverse direction T. Furthermore, ones of aggressor differential signal pairs 266 can be disposed first and third linear arrays 251, and thus spaced from the victim differential signal pair 266 along one or both of the lateral direction A and the transverse direction T. The differential signal contacts of all of the linear arrays, including the aggressor differential signal pairs, are configured to transfer differential signals between the respective mating ends and mounting ends at data transfer rates while producing produce no more than six percent worst-case, asynchronous multi-active cross talk on the victim differential signal pair. The data transfer rates can be between and include six-and-one-quarter gigabits per second (6.25 Gb/s) and approximately fifty gigabits per second (50 Gb/s) (including approximately fifteen gigabits per second (15 Gb/s), eighteen gigabits per second (18 Gb/s), twenty gigabits per second (20 Gb/s), twenty-five gigabits per second (25 Gb/s), thirty gigabits per second (30 Gb/s), and approximately forty gigabits per second (40 Gb/s)).

When the plurality of leadframe assemblies 230 are disposed in the connector housing 206 in accordance with the illustrated embodiment, the tips 264 of the signal contacts 252 and the tips 280 of the ground mating ends 272 of each of the plurality of electrical contacts 250 can be disposed in the connector housing 206 such that the tips 264 and 280 are rearwardly recessed from the front end 208a of the housing body 208 with respect to the longitudinal direction L. In this regard, it can be said that the connector housing 206 extends beyond the tips 264 of the receptacle mating ends 256 of the signal contacts 252 and beyond the tips 280 of the receptacle ground mating ends 272 of the ground plate 268 along the mating direction. Thus, the front end 208a can protect the electrical contacts 250, for example by preventing contact between the tips 264 and 280 and objects disposed adjacent the front end 208a of the housing body 208. Without being bound by theory, it is believed that substantially encapsulating each of first and second pluralities of electrical contacts 150 and 250 enhances the electrical performance characteristics of the electrical connector assembly 10 and thus of the first and second electrical connectors 100 and 200. Furthermore, without being bound by theory, it is believed that the shape of the mating ends of the electrical contacts 150 and 250 enhances the electrical performance characteristics of the electrical connector assembly 10 and thus of the first and second electrical connectors 100 and 200. For instance, electrical simulation has demonstrated that the herein described embodiments of the first and second electrical connectors 100, and 200, respectively, can operate to transfer data, for example between the respective mating and mounting ends of each electrical contact, in the range between and including approximately eight gigabits per second (8 Gb/s) and approximately fifty gigabits per second (50 Gb/s) (including approximately twenty five gigabits per second (25 Gb/s), approximately thirty gigabits per second (30 Gb/s), and approximately forty gigabits per second (40 Gb/s)), such as at a minimum of approximately thirty gigabits per second (30 Gb/s), including any 0.25 gigabits per second (Gb/s) increments between approximately therebetween, with worst-case, multi-active crosstalk that does not exceed a range of about 0.1%-6%, including all sub ranges and all integers, for instance 1%-2%, 2%-3%, 3%-4%, 4%-5%, and 5%-6% including 1%, 2%, 3%, 4%, 5%, and 6% within acceptable crosstalk levels, such as below about six percent (6%), approximately. Furthermore, the herein described embodiments of the first and second electrical connectors 100 and 200, respectively can operate in the range between and including approximately 1 and 25 GHz, including any 0.25 GHz increments between 1 and 25 GHz, such as at approximately 15 GHz.

The electrical connectors as described herein can have edge-coupled differential signal pairs and can transfer data signals between the mating ends and the mounting ends of the electrical contacts 150 to at least approximately 28, 29, 30, 31, 32, 33, 34, 35, 36, 37, 38, 39 or 40 Gigabits per second (or any 0.1 Gigabits per second increment between) (at approximately 30 to 25 picosecond rise times) with asynchronous, multi-active, worst-case crosstalk on a victim pair of no more than six percent, while simultaneously maintaining differential impedance at plus or minus ten percent of a system impedance (typically 85 or 100 Ohms) and simultaneously keeping insertion loss within a range of at approximately zero to −1 dB through 20 GHz (simulated) through within a range of approximately 20 GHz zero to −2 dB through 30 GHz (simulated), and within a range of zero to −4 dB through 33 GHz, and within a range of approximately zero to −5 dB through 40 GHz. At a 10 Gbits/sec data transfer rate, simulation produces integrated crosstalk noise (ICN), which can be all NEXT values that do not exceed 3.5 and ICN (all FEXT) values below 1.3. At a 20 Gbit/sec data transfer rate, simulation produces ICN (all NEXT) values below 5.0 and ICN (all FEXT) values below 2.5. At a 30 Gbit/sec data transfer rate, simulation produces ICN (all NEXT) values below 5.3 and ICN (all FEXT) below 4.1. At a 40 Gbit/sec data transfer rate, simulation produces ICN (all NEXT) values below 8.0 and ICN (all FEXT) below 6.1. It is recognized that 2 Gbit/s is approximately 1 GHz.

It should be appreciated from the description herein that an electrical connector with edge-coupled differential signal pairs may include a crosstalk limiter such as a shield, metallic plate, or a resonance reduction member (lossy type of shield) positioned between adjacent columns (along the transverse direction T) or rows (along the lateral direction A) of differential signal pairs and between adjacent differential signal pairs within a column direction or row direction. The crosstalk limiter, in combination with a receptacle-to-receptacle electrical connector mating interface, has been shown in electrical model simulation to increase data transfer of an electrical connector to 40 Gigabits per second without an increase asynchronous, multi-active, worst-case crosstalk beyond six percent, with a differential impedance to plus or minus ten percent of a system impedance, with an insertion loss of approximately −0.5 dB at 15 GHz and approximately −1 dB at 21 GHz (a data transfer rate of approximately 42 Gbits/sec), and a differential pair density of approximately 70 to 83 or 84 to 100 differential signal pairs per linear inch of card edge or approximately 98 to 99 differential signal pairs per square inch), such that an inch in a column direction will contain a low speed signal contact and 7 differential pairs with interleaved grounds. In order to achieve this differential pair density, the center-to-center column pitch along the row direction can be in the range of 1.5 mm to 3.6 mm, including 1.5 mm to 3.0 mm, including 1.5 mm to 2.5 mm, such as 1.8 mm, and the center-to-center row pitch along the column direction can be in the range of 1.2 mm to 2.0 mm, and can be variable. Of course the contacts can be otherwise arranged to achieve any desired differential pair density as desired.

It should be further appreciated that a method can be provided for placing the first substrate 300a in electrical communication with the second substrate 300b. The method can include the steps of mounting the first electrical connector 100 to the first substrate 300a in the manner described above, mounting the second electrical connector 200 to the second substrate 300b in the manner described above, and mating the first electrical connector 100 to the second electrical connector 200 in the manner described above, such that the second substrate 300b is oriented substantially perpendicular to the first substrate 300a. For instance, the mating step can include the step of spacing an entirety of the second substrate 300b from the first plane defined by the first substrate 300a, and positioning at least a portion of the one of the an edges 304 of the second substrate 300b such that the at least a portion of the one of the edges 304 faces the first substrate 300a. The mating step can further include the step of bringing one of the first and second sides 208e and 208f of the second electrical connector 200 to a position substantially flush with the upper surface 108f of the first electrical connector 100. The mating step can further include the step of comprises positioning the second matrix of the mating ends of the electrical contacts 250 at a location fully contained between the midline and the upper surface 108f of the first housing 106 with respect to the lateral direction A. The mating step can further include the step of abutting the one of the edges 304 of the second substrate 300b against the first surface 301a of the first substrate 300a. The method can further include the step of directing air from one of the first and second sides 303a and 303b of the second substrate 300b, through at least one of the first substrate 300a, the second substrate 300b, and an interface between the first and second substrates 300a and 300b, to the other of the first and second sides 303a and 303b of the second substrate 300b. The step of directing the air can include the step of directing the air through the at least one air ventilation opening 305. A method can also include the step of teaching any one or more up to all of the above method steps to a third party, and offering for sale and/or selling to the third party at least one or more up to all of the first and second substrates 300a and 300b and the first and second electrical connectors 100 and 200.

The foregoing description is provided for the purpose of explanation and is not to be construed as limiting the electrical connector. While various embodiments have been described with reference to preferred embodiments or preferred methods, it is understood that the words which have been used herein are words of description and illustration, rather than words of limitation. Furthermore, although the embodiments have been described herein with reference to particular structure, methods, and embodiments, the electrical connector is not intended to be limited to the particulars disclosed herein. For instance, it should be appreciated that structure and methods described in association with one embodiment are equally applicable to all other embodiments described herein unless otherwise indicated. Those skilled in the relevant art, having the benefit of the teachings of this specification, may effect numerous modifications to the electrical connector as described herein, and changes may be made without departing from the spirit and scope of the electrical connector, for instance as set forth by the appended claims.

What is claimed:

1. An electrical connector assembly comprising:
 a first electrical connector comprising:
  a housing having a front surface, a rear surface opposite the front surface, a top surface and a bottom surface opposite the top surface; and
  a first mating interface and a first mounting interface, wherein the first electrical connector comprises a first plurality of leadframe assemblies, each of the first plurality of leadframe assemblies comprising:
   a dielectric portion, and
   a plurality of electrical contacts held in a column by the dielectric portion, each of the electrical contacts comprising a mating end positioned at the first mating interface and a mounting end positioned at the first mounting interface and each of the electrical contacts in the column being configured such that the mating end is positioned a different distance from the mounting end, wherein the first mating interface occupies a sub-portion of the front surface that is adjacent to the top surface, and the first mounting interface occupies a sub-portion of the bottom surface that is adjacent to the rear surface; and a second electrical connector comprising:

a second mating interface and a second mounting interface, wherein the second electrical connector comprises a second plurality of leadframe assemblies, wherein the second mating interface is configured to mate with the first mating interface, and each of the second plurality of leadframe assemblies comprises:

a dielectric portion; and a plurality of electrical contacts held in a row by the dielectric portion, each of the electrical contacts comprising a mating end positioned at the second mating interface and a mounting end positioned at the second mounting interface and each of the electrical contacts in the row being configured such that the mating end is positioned a same distance from the mounting end.

2. The electrical connector assembly of claim 1, wherein: when the first electrical connector is mated to the second electrical connector, the first mating interface is in a first plane and the second mating interface is in a second plane and the second plane is orthogonal to the first plane.

3. The electrical connector assembly of claim 1, wherein the first connector further comprises a plurality of ground plates, each of the plurality of ground plates being positioned adjacent the plurality of electrical contacts of a respective first leadframe assembly, and each of the plurality of ground plates comprising a plurality of ribs extending towards the electrical contacts.

4. The electrical connector assembly of claim 3, wherein each of the first plurality of leadframe assemblies comprises a plurality of pairs of signal conductors and the ribs of the respective ground plate are positioned between adjacent pairs.

5. The electrical connector assembly of claim 4, wherein each pair of signal conductors is configured to carry a differential signal.

6. The electrical connector assembly of claim 4, further comprising a plurality of ground contacts, each of the plurality of ground contacts being positioned between adjacent pairs of signal conductors.

7. The electrical connector assembly of claim 3, wherein each of the first plurality of leadframe assemblies comprises a plurality of recessed regions, each of the plurality of recessed regions being configured to receive a respective rib.

8. The electrical connector assembly of claim 1, wherein each of the first plurality of leadframe assemblies comprises a lossy material.

9. The electrical connector assembly of claim 1, wherein the plurality of mating ends have equal shapes.

10. The electrical connector assembly of claim 1, wherein at least one mating end of the first electrical connector and a respective mating end of the second electrical connector have equal shapes.

11. An electrical connector assembly comprising:

a first electrical connector comprising a plurality of leadframe assemblies and a housing having a front surface, a rear surface opposite the front surface, a top surface and a bottom surface opposite the top surface, each of the plurality of leadframe assemblies comprising:

a dielectric portion supported by the housing, and a plurality of electrical contacts held in a column by the dielectric portion, each one of the electrical contacts comprising a mating end located at the front surface, a mounting end located at the bottom surface, and a bent region disposed between the mating end and the mounting end, wherein the mating end comprises a broadside defining a first plane and the bent region is bent within a second plane that is orthogonal to the first plane, wherein the plurality of mating ends of the first electrical connector occupy a sub-portion of the front surface that is adjacent to the top surface, and the plurality of mounting ends of the first electrical connector occupy a sub-portion of the bottom surface that is adjacent to the rear surface; and a second electrical connector configured to mate with the first electrical connector, the second electrical connector comprising a plurality of leadframe assemblies each of the plurality of leadframe assemblies comprising:

a dielectric portion, and a plurality of electrical contacts held in a row by the dielectric portion, each one of the electrical contacts comprising a mating end, a mounting end and a bent region disposed between the mating end and the mounting end, wherein the mating end comprises a broadside defining a third plane and the bent region is bent within the third plane, wherein the third plane is parallel to the first plane.

12. The electrical connector assembly of claim 11, wherein:

when the first electrical connector is mated to the second electrical connector, at least one broadside of the first connector abuts a respective broadside of the second electrical connector.

13. The electrical connector assembly of claim 11, wherein at least one mating end of the first electrical connector and a respective mating end of the second electrical connector have equal shapes.

14. An electrical connector comprising:

a housing comprising a front surface, a rear surface opposite the front surface, a top surface, and a bottom surface opposite the top surface;

a mating interface located at the front surface of the housing and a mounting interface located at the bottom surface of the housing;

a plurality of leadframe assemblies supported by the housing, each of the plurality of leadframe assemblies comprising a plurality of electrical contacts, and each of the plurality of electrical contacts comprising a mating end positioned at the mating interface, a mounting end positioned at the mounting interface and a bent region disposed between the mating end and the mounting end; and wherein the mating interface occupies a sub-portion of the front surface of the housing and the mounting interface occupies a sub-portion of the bottom surface of the housing, wherein the sub-portion of the front surface occupied by the mating interface is distal the bottom surface, and the sub-portion of the bottom surface occupied by the mounting interface is distal the front surface.

15. The electrical connector of claim 14, wherein the front surface and the bottom surface are orthogonal.

16. The electrical connector of claim 14, wherein the mounting end is configured to be mounted on a substrate facing the bottom surface of the housing.

17. The electrical connector of claim 14, wherein at least one of the plurality of electrical contacts is L-shaped.

18. The electrical connector of claim 14, further comprising a plurality of ground plates, each of the plurality of ground plates being positioned adjacent the plurality of electrical contacts of a respective leadframe assembly, and each of the plurality of ground plates comprising a plurality of ribs extending towards the electrical contacts.

19. The electrical connector of claim 14, wherein the mating interface is disposed between the top surface and a midline that is disposed midway between the top surface and the bottom surface.

20. The electrical connector of claim 11, wherein the sub-portion of the front surface is disposed between the top surface and a midline that is disposed midway between the top surface and the bottom surface.

* * * * *